United States Patent
Yamashita et al.

(10) Patent No.: US 11,135,761 B2
(45) Date of Patent: Oct. 5, 2021

(54) PROCESS FOR PRODUCING RECEIVING OBJECT HAVING TRANSFERRED PATTERN

(71) Applicant: DAIKIN INDUSTRIES, LTD., Osaka (JP)

(72) Inventors: Tsuneo Yamashita, Osaka (JP); Eiji Sakamoto, Osaka (JP); Kakeru Hanabusa, Osaka (JP); Saya Nil, Osaka (JP); Takayuki Araki, Osaka (JP)

(73) Assignee: DAIKIN INDUSTRIES, LTD., Osaka (JP)

(*) Notice: Subject to any disclaimer, the term of this patent is extended or adjusted under 35 U.S.C. 154(b) by 118 days.

(21) Appl. No.: 16/309,319

(22) PCT Filed: Jun. 14, 2017

(86) PCT No.: PCT/JP2017/021901
§ 371 (c)(1),
(2) Date: Dec. 12, 2018

(87) PCT Pub. No.: WO2017/217442
PCT Pub. Date: Dec. 21, 2017

(65) Prior Publication Data
US 2019/0308365 A1    Oct. 10, 2019

(30) Foreign Application Priority Data

Jun. 14, 2016 (JP) .............................. JP2016-118173
Jul. 12, 2016 (JP) .............................. JP2016-138001

(51) Int. Cl.
*B29C 59/04*    (2006.01)
*B29C 33/62*    (2006.01)
(Continued)

(52) U.S. Cl.
CPC .............. *B29C 59/04* (2013.01); *B29C 33/62* (2013.01); *B29C 35/0805* (2013.01);
(Continued)

(58) Field of Classification Search
CPC ............ B29C 2035/0827; B29C 33/62; B29C 35/0805; B29C 59/02; B29C 59/04;
(Continued)

(56) References Cited

U.S. PATENT DOCUMENTS

2010/0126380 A1    5/2010    Itami et al.
2013/0140744 A1    6/2013    Nakai et al.
(Continued)

FOREIGN PATENT DOCUMENTS

EP    1 869 103 B1    5/2017
JP    2002-283354 A   10/2002
(Continued)

OTHER PUBLICATIONS

Communication dated Jan. 8, 2020 from European Patent Office in counterpart EP Application No. 17813337.7.
(Continued)

*Primary Examiner* — Michael M. Robinson
*Assistant Examiner* — Victoria Bartlett
(74) *Attorney, Agent, or Firm* — Sughrue Mion; PLLC

(57) ABSTRACT

The invention provides a method for producing a transfer target which is less likely to separate from a substrate or adhere to a mold even when transfer is repeated. The production method includes the steps of: (1) applying a composition containing a fluoropolyether to a release layer of a mold having an uneven pattern on a surface thereof; (2) pressing the mold to a transfer target and transferring the uneven pattern; and (3) releasing the mold from the transfer target, thereby providing the transfer target having a transferred pattern.

6 Claims, 1 Drawing Sheet

(51) Int. Cl.
  *B29C 35/08* (2006.01)
  *C08G 65/00* (2006.01)
  *C08G 65/336* (2006.01)
  *H01L 21/027* (2006.01)
  *B29C 59/02* (2006.01)
  *B29K 71/00* (2006.01)

(52) U.S. Cl.
  CPC ............ *B29C 59/02* (2013.01); *C08G 65/007* (2013.01); *C08G 65/336* (2013.01); *H01L 21/027* (2013.01); *B29K 2071/00* (2013.01)

(58) Field of Classification Search
  CPC . B29K 2071/00; H01L 21/027; C08G 65/007; G08G 65/336
  See application file for complete search history.

(56) References Cited

U.S. PATENT DOCUMENTS

2013/0291890 A1* 11/2013 Yoshida ................ B82Y 40/00
  134/1
2016/0355638 A1* 12/2016 Sakoh .................. C08G 65/007

FOREIGN PATENT DOCUMENTS

| JP | 2008-178984 A | 8/2008 |
| JP | 2013-074257 A | 4/2013 |
| JP | 2013-229532 A | 11/2013 |
| KR | 10-2009-0023715 A | 3/2009 |
| WO | 2011/155480 A1 | 12/2011 |

OTHER PUBLICATIONS

International Search Report PCT/JP2017/021901 dated Jul. 25, 2017 [PCT/ISA/210].
International Preliminary Report on Patentability with translation of Written Opinion dated Dec. 18, 2018, issued by the International Searching Authority in application No. PCT/JP2017/021901.

* cited by examiner

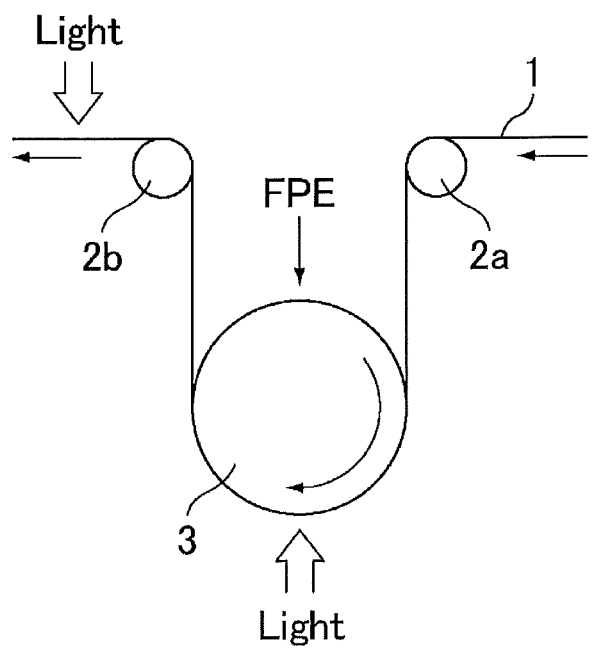

PROCESS FOR PRODUCING RECEIVING OBJECT HAVING TRANSFERRED PATTERN

CROSS REFERENCE TO RELATED APPLICATIONS

This application is a National Stage of International Application No. PCT/JP2017/021901, filed Jun. 14, 2017, claiming priority based on Japanese Patent Application No. 2016-118173, filed Jun. 14, 2016 and Japanese Patent Application No. 2016-138001, filed Jul. 12, 2016.

TECHNICAL FIELD

The invention relates to methods for producing a transfer target having a transferred pattern.

BACKGROUND ART

Release agents are used for improving the releasability between a mold (cast) and a polymer resin serving as a material to be processed in general machine processing. Conventionally known release agents include silicone oil and fluororesin solutions. Silicone oil or a fluororesin solution, when used as a release agent for an imprint mold (a mold for imprint processing), unfortunately enter recessed grooves with a micrometer-scale width and depth of the fine pattern of a mold. This prevents transfer of a normal pattern by pressing.

In order to solve such a problem, Patent Literature 1 proposes a mold for imprint processing covered with perfluoropolyether containing a functional group that is chemically reactive with the material of a mold.

CITATION LIST

Patent Literature

Patent Literature 1: JP 2002-283354 A

SUMMARY OF INVENTION

Technical Problem

Conventional molds for imprint processing have insufficient releasability with transfer targets, causing easy separation of transfer targets from substrates or adhesion thereof to molds when transfer is repeated.

The invention is made in view of the above current state of the art, and aims to provide a method for producing a transfer target having a transferred pattern which is less likely to separate from a substrate or adhere to a mold even when transfer is repeated.

Solution to Problem

The inventors studied solutions to the above problem, and found that fluoropolyether applied to a release layer of a mold can improve the releasability, completing the invention.

Specifically, the invention relates to a method for producing a transfer target, including the steps of: (1) applying a composition containing a fluoropolyether to a release layer of a mold having an uneven pattern on a surface thereof; (2) pressing the mold to a transfer target and transferring the uneven pattern; and (3) releasing the mold from the transfer target, thereby providing the transfer target having a transferred pattern.

The transfer target preferably contains an ultraviolet-curable resin.

In the step (2), preferably, the transfer target is irradiated with ultraviolet rays while the mold is pressed to the transfer target.

The composition preferably further contains a solvent.

Advantageous Effects of Invention

The production method of the invention is less likely to cause separation of a transfer target from a substrate or adhesion thereof to a mold even when transfer is repeated, and thus can produce a transfer target having a transferred pattern at high productivity and low cost.

BRIEF DESCRIPTION OF THE DRAWINGS

FIG. 1 is a view illustrating an embodiment of the production method of the invention.

DESCRIPTION OF EMBODIMENTS

The invention will be specifically described hereinbelow.

The production method of the invention includes steps (1) to (3). These steps are described hereinbelow.

In the step (1), a composition containing a fluoropolyether is applied to a release layer of a mold having an uneven pattern on a surface thereof.

The uneven pattern may be a very fine uneven pattern of a nanometer scale. In other words, the production method of the invention can produce a nanoimprint film.

The material of the mold may appropriately be selected in accordance with the purpose and necessity, and may be any of metals, metal oxides, quartz, polymer resins such as silicone, semiconductors, insulators, and any composite materials thereof.

The mold may have any shape such as a roll-like shape or a plate-like shape. In order to achieve continual transfer, the mold preferably has a roll-like shape.

The mold provided with the release layer preferably has a water contact angle of 80° or greater, more preferably 100° or greater, while preferably 180° or smaller. The water contact angle can be determined using a contact angle meter. The water contact angle means the water contact angle of the mold before the composition is applied thereto.

In order to achieve excellent adhesiveness between the release layer and the mold, the release layer preferably contains a compound containing a hydrolyzable group. The "hydrolyzable group" as used herein means a group that can be separated from the main skeleton of the compound by hydrolysis. Examples of the hydrolyzable group include —OR, —OCOR, —O—N=CR$_2$, —NR$_2$, —NHR, and halogens (wherein R is a substituted or unsubstituted C1-C4 alkyl group). Preferred is —OR (i.e., an alkoxy group). Examples of the group for R include unsubstituted alkyl groups such as methyl, ethyl, propyl, isopropyl, n-butyl, and isobutyl groups, and substituted alkyl groups such as a chloromethyl group. Preferred among these are alkyl groups, particularly unsubstituted alkyl groups, and more preferred is a methyl group or an ethyl group.

In order to achieve excellent adhesiveness between the release layer and the mold, the release layer preferably contains a compound containing a group represented by the following formula:

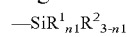

wherein $R^1$ is a hydrolyzable group; $R^2$ is a hydrogen atom or a C1-C22 alkyl group; and n1 is an integer of 1 to 3.

In order to achieve much better releasability and excellent adhesiveness between the release layer and the mold, the release layer preferably contains a perfluoro(poly)ether group-containing silane compound.

The release layer preferably contains at least one perfluoro(poly)ether group-containing silane compound represented by any of the following formulae (A1), (A2), (B1), (B2), (C1), (C2), (D1), and (D2):

[Chem. 1]

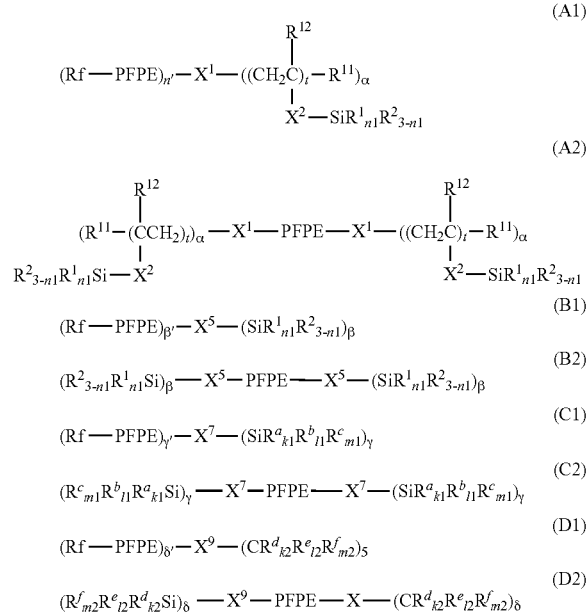

wherein

PFPEs are each individually a group represented by the formula:

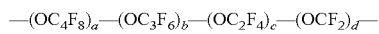

—(OC$_4$F$_8$)$_a$—(OC$_3$F$_6$)$_b$—(OC$_2$F$_4$)$_c$—(OCF$_2$)$_d$—

(wherein a, b, c, and d are each individually an integer of 0 to 200; the sum of a, b, c, and d is at least 1; and the parenthesized repeating units with the respective subscripts a, b, c, and d may be present in any order in the formula);

Rfs are each individually a C1-C16 alkyl group optionally substituted by one or more fluorine atoms;

$R^1$s are each individually a hydrolyzable group;

$R^2$s are each individually a hydrogen atom or a C1-C22 alkyl group;

$R^{11}$s are each individually a hydrogen atom or a halogen atom;

$R^{12}$s are each individually a hydrogen atom or a lower alkyl group;

n1 is an integer of 0 to 3 individually in each (—SiR$^1_{n1}$R$^2_{3-n1}$) unit, and at least one n1 in each of the formulae (A1), (A2), (B1), and (B2) is an integer of 1 to 3;

$X^1$s are each individually a single bond or a divalent to decavalent organic group;

$X^2$s are each individually a single bond or a divalent organic group;

ts are each individually an integer of 1 to 10;

αs are each individually an integer of 1 to 9;

α's are each individually an integer of 1 to 9;

$X^5$s are each individually a single bond or a divalent to decavalent organic group;

βs are each individually an integer of 1 to 9;

β's are each individually an integer of 1 to 9;

$X^7$s are each individually a single bond or a divalent to decavalent organic group;

γs are each individually an integer of 1 to 9;

γ's are each individually an integer of 1 to 9;

$R^a$s are each individually —Z$^1$—SiR$^{71}_{p1}$R$^{72}_{q1}$R$^{73}_{r1}$, $Z^1$s are each individually an oxygen atom or a divalent organic group;

$R^{71}$s are each individually $R^{a'}$;

$R^{a'}$ is defined in the same manner as $R^a$;

in $R^a$, the number of Si linearly linked via the $Z^1$ group is at most five;

$R^{72}$s are each individually a hydrolyzable group;

$R^{73}$s are each individually a hydrogen atom or a lower alkyl group;

p1s are each individually an integer of 0 to 3;

q1s are each individually an integer of 0 to 3;

r1s are each individually an integer of 0 to 3;

at least one q1 in each of the formulae (C1) and (C2) is an integer of 1 to 3;

$R^b$s are each individually a hydrolyzable group;

$R^c$s are each individually a hydrogen atom or a lower alkyl group;

k1s are each individually an integer of 1 to 3;

l1s are each individually an integer of 0 to 2;

m1s are each individually an integer of 0 to 2;

the sum of k1, l1, and m1 in the parenthesized unit with the subscript γ is 3;

$X^9$s are each individually a single bond or a divalent to decavalent organic group;

δs are each individually an integer of 1 to 9;

δ's are each individually an integer of 1 to 9;

$R^d$s are each individually —Z$^2$—CR$^{81}_{p2}$R$^{82}_{q2}$R$^{83}_{r2}$, $Z^2$s are each individually an oxygen atom or a divalent organic group;

$R^{81}$s are each individually $R^{d'}$;

$R^{d'}$ is defined in the same manner as $R^d$;

in $R^d$, the number of C linearly linked via the $Z^2$ group is at most five;

$R^{82}$s are each individually —Y—SiR$^{85}_{n2}$R$^{86}_{3-n2}$;

Ys are each individually a divalent organic group;

$R^{85}$s are each individually a hydrolyzable group;

$R^{86}$s are each individually a hydrogen atom or a lower alkyl group;

n2 is an integer of 1 to 3 individually in each (—Y—SiR$^{85}_{n2}$R$^{86}_{3-n2}$) unit, and at least one n2 in each of the formulae (C1) and (C2) is an integer of 1 to 3;

$R^{83}$s are each individually a hydrogen atom or a lower alkyl group;

p2s are each individually an integer of 0 to 3;

q2s are each individually an integer of 0 to 3;

r2s are each individually an integer of 0 to 3;

$R^e$s are each individually —Y—SiR$^{85}_{n2}$R$^{86}_{3-n2}$;

$R^f$s are each individually a hydrogen atom or a lower alkyl group;

k2s are each individually an integer of 0 to 3;

l2s are each individually an integer of 0 to 3;

m2s are each individually an integer of 0 to 3; and in each of the formulae (D1) and (D2), at least one q2 is 2 or 3 or at least one l2 is 2 or 3, and the sum of k2, l2, and m2 is 3.

The perfluoro(poly)ether group-containing silane compounds represented by the respective formulae (A1), (A2), (B1), (B2), (C1), (C2), (D1), and (D2) are described hereinbelow.

The formulae (A1) and (A2) are as follows.

[Chem. 2]

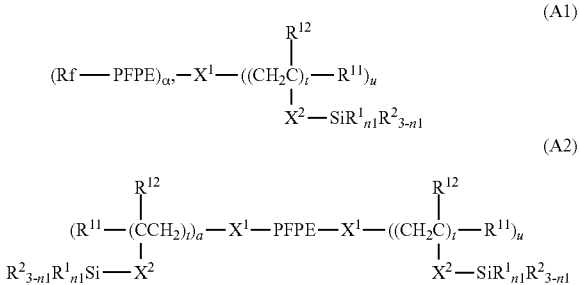

(A1)

(A2)

In the formulae, PFPE is $-(OC_4F_8)_a-(OC_3F_6)_b-(OC_2F_4)_c-(OCF_2)_d-$, which corresponds to a perfluoro(poly)ether group. In the formulae, a, b, c, and d are each individually 0 or an integer of 1 or greater, and the sum of a, b, c, and d is at least 1. Preferably, a, b, c, and d are each individually an integer of 0 or greater and 200 or smaller, for example an integer of 1 to 200, more preferably an integer of 0 or greater and 100 or smaller. Preferably, the sum of a, b, c, and d is 5 or greater, more preferably 10 or greater, for example 10 or greater and 100 or smaller. The parenthesized repeating units with the respective subscripts a, b, c, and d may be present in any order in the formula. The repeating unit $-(OC_4F_8)-$ among these repeating units may be any of $-(OCF_2CF_2CF_2CF_2)-$, $-(OCF(CF_3)CF_2CF_2)-$, $-(OCF_2CF(CF_3)CF_2)-$, $-(OCF_2CF_2CF(CF_3))-$, $-(OC(CF_3)_2CF_2)-$, $-(OCF_2C(CF_3)_2)-$, $-(OCF(CF_3)CF(CF_3))-$, $-(OCF(C_2F_5)CF_2)-$, and $-(OCF_2CF(C_2F_5))-$, and is preferably $-(OCF_2CF_2CF_2CF_2)-$. The repeating unit $-(OC_3F_6)-$ may be any of $-(OCF_2CF_2CF_2)-$, $-(OCF(CF_3)CF_2)-$, $-(OCF_2CF(CF_3))-$, and is preferably $-(OCF_2CF_2CF_2)-$. The repeating unit $-(OC_2F_4)-$ may be any of $-(OCF_2CF_2)-$ and $-(OCF(CF_3))-$, and is preferably $-(OCF_2CF_2)-$.

In an embodiment, PFPE is $-(OC_3F_6)_b-$ (wherein b is an integer of 1 or greater and 200 or smaller, preferably 5 or greater and 200 or smaller, more preferably 10 or greater and 200 or smaller), preferably $-(OCF_2CF_2CF_2)_b-$ (wherein b is an integer of 1 or greater and 200 or smaller, preferably 5 or greater and 200 or smaller, more preferably 10 or greater and 200 or smaller) or $-(OCF(CF_3)CF_2)_b-$ (wherein b is an integer of 1 or greater and 200 or smaller, preferably 5 or greater and 200 or smaller, more preferably 10 or greater and 200 or smaller), more preferably $-(OCF_2CF_2CF_2)_b-$ (wherein b is an integer of 1 or greater and 200 or smaller, preferably 5 or greater and 200 or smaller, more preferably 10 or greater and 200 or smaller).

In another embodiment, PFPE is $-(OC_4F_8)_a-(OC_3F_6)_b-(OC_2F_4)_c-(OCF_2)_d-$ (wherein a and b are each individually an integer of 0 or greater and 30 or smaller; c and d are each individually an integer of 1 or greater and 200 or smaller, preferably 5 or greater and 200 or smaller, more preferably 10 or greater and 200 or smaller; and the parenthesized repeating units with the respective subscripts a, b, c, and d may be present in any order in the formula), preferably $-(OCF_2CF_2CF_2CF_2)_a-(OCF_2CF_2CF_2)_b-$ $(OCF_2CF_2)_c-(OCF_2)_d-$. In an embodiment, PFPE may be $-(OC_2F_4)_c-(OCF_2)_d-$ (wherein c and d are each individually an integer of 1 or greater and 200 or smaller, preferably 5 or greater and 200 or smaller, more preferably 10 or greater and 200 or smaller, and the parenthesized repeating units with the respective subscripts c and d may be present in any order in the formula).

In another embodiment, PFPE is a group represented by $-(OC_2F_4-R^8)_f-$. In the formula, $R^8$ is a group selected from $OC_2F_4$, $OC_3F_6$, and $OC_4F_8$ or any combination of two or three groups individually selected from these groups. Examples of the combination of two or three groups individually selected from $OC_2F_4$, $OC_3F_6$, and $OC_4F_8$ include, but are not limited to, $-OC_2F_4OC_3F_6-$, $-OC_2F_4OC_4F_8-$, $-OC_3F_6OC_2F_4-$, $-OC_3F_6OC_3F_6-$, $-OC_3F_6OC_4F_8-$, $-OC_4F_8OC_4F_8-$, $-OC_4F_8OC_3F_6-$, $-OC_4F_8OC_2F_4-$, $-OC_2F_4OC_2F_4OC_3F_6-$, $-OC_2F_4OC_2F_4OC_4F_8-$, $-OC_2F_4OC_3F_6OC_2F_4-$, $-OC_2F_4OC_3F_6OC_3F_6-$, $-OC_2F_4OC_4F_8OC_2F_4-$, $-OC_3F_6OC_2F_4OC_2F_4-$, $-OC_3F_6OC_2F_4OC_3F_6-$, $-OC_3F_6OC_3F_6OC_2F_4-$, and $-OC_4F_8OC_2F_4OC_2F_4-$. In the formula, f is an integer of 2 to 100, preferably an integer of 2 to 50. In the formula, $OC_2F_4$, $OC_3F_6$, and $OC_4F_8$ each may be either linear or branched, preferably linear. In this embodiment, PFPE is preferably $-(OC_2F_4-OC_3F_6)_f-$ or $-(OC_2F_4-OC_4F_8)_f-$.

In the formulae, Rf is a C1-C16 alkyl group optionally substituted by one or more fluorine atoms.

The "C1-C16 alkyl group" in the C1-C16 alkyl group optionally substituted by one or more fluorine atoms may be either linear or branched, and is preferably a linear or branched C1-C6, particularly C1-C3, alkyl group, more preferably a linear C1-C3 alkyl group.

Rf is preferably a C1-C16 alkyl group substituted by one or more fluorine atoms, more preferably a fluoroalkylene group represented by $CF_2H-C_{1-15}$, still more preferably a C1-C16 perfluoroalkyl group.

The C1-C16 perfluoroalkyl group may be either linear or branched, and is preferably a linear or branched C1-C6, particularly C1-C3, perfluoroalkyl group, more preferably a linear C1-C3 perfluoroalkyl group, specifically $-CF_3$, $-CF_2CF_3$, or $-CF_2CF_2CF_3$.

In the formulae, $R^1$s are each individually a hydrolyzable group.

In the formulae, $R^2$s are each individually a hydrogen atom or a C1-C22 alkyl group, preferably a C1-C4 alkyl group.

The "hydrolyzable group" as used herein means a group that can be separated from the main skeleton of the compound by hydrolysis. Examples of the hydrolyzable group include $-OR$, $-OCOR$, $-O-N=CR_2$, $-NR_2$, $-NHR$, and halogens (wherein R is a substituted or unsubstituted C1-C4 alkyl group). Preferred is $-OR$ (i.e., an alkoxy group). Examples of the group for R include unsubstituted alkyl groups such as methyl, ethyl, propyl, isopropyl, n-butyl, and isobutyl groups, and substituted alkyl groups such as a chloromethyl group. Preferred among these are alkyl groups, particularly unsubstituted alkyl groups, and more preferred is a methyl group or an ethyl group.

In the formulae, $R^{11}$s are each individually a hydrogen atom or a halogen atom. The halogen atom is preferably an iodine atom, a chlorine atom, or a fluorine atom, more preferably a fluorine atom.

In the formulae, $R^{12}$s are each individually a hydrogen atom or a lower alkyl group. The lower alkyl group is preferably a C1-C20 alkyl group, more preferably a C1-C6 alkyl group, such as a methyl group, an ethyl group, or a propyl group.

In the formulae, n1 is an integer of 0 to 3, preferably 1 to 3, more preferably 3, individually in each ($-SiR^1_{n1}R^2_{3-n1}$) unit. Not all of n1s in the formula are 0. In other words, at least one $R^1$ is present in the formula.

In the formulae, $X^1$s are each individually a single bond or a divalent to decavalent organic group. This $X^1$ is understood as a linker that couples a perfluoropolyether moiety (i.e., Rf-PFPE moiety or -PFPE-moiety) mainly providing properties such as water repellency and surface smoothness and a silane moiety (i.e., a parenthesized group with a) providing the adhesiveness to a substrate in the compounds represented by the formulae (A1) and (A2). Thus, the $X^1$ may be any organic group that allows the compounds represented by the formulae (A1) and (A2) to be present stably.

In the formulae, α is an integer of 1 to 9 and α' is an integer of 1 to 9. These α and a' may vary in accordance with the valence of $X^1$. In the formula (A1), the sum of α and α' is the same as the valence of $X^1$. For example, when $X^1$ is a decavalent organic group, the sum of α and α' is 10, where α is 9 and α' is 1, α is 5 and α' is 5, or α is 1 and α' is 9, for example. When $X^1$ is a divalent organic group, α and α' are both 1. In the formula (A2), α is a value obtained by subtracting 1 from the valence of $X^1$.

$X^1$ is preferably a divalent to heptavalent, more preferably divalent to tetravalent, still more preferably divalent organic group.

In an embodiment, $X^1$ is a divalent to tetravalent organic group, α is 1 to 3, and α' is 1.

In another embodiment, $X^1$ is a divalent organic group, α is 1, and α' is 1. In this embodiment, the formulae (A1) and (A2) are represented by the following formulae (A1') and (A2').

[Chem. 3]

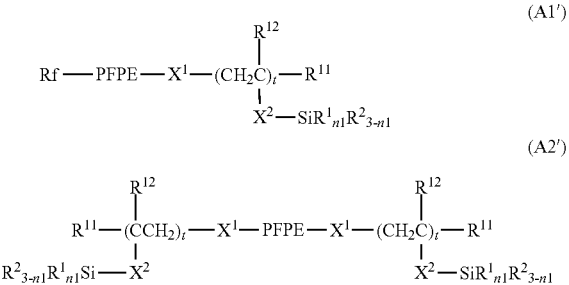

Examples of $X^1$ include, but are not limited to, divalent groups represented by the following formula:

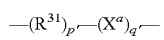

wherein $R^{31}$ is a single bond, $-(CH_2)_{s'}-$, or an o-, m-, or p-phenylene group, preferably $-(CH_2)_{s'}-$;

s' is an integer of 1 to 20, preferably an integer of 1 to 6, more preferably an integer of 1 to 3, still more preferably 1 or 2;

$X^a$ is $-(X^b)_{l'}-$;

$X^b$s are each individually a group selected from the group consisting of $-O-$, $-S-$, an o-, m-, or p-phenylene group, $-C(O)O-$, $-Si(R^{33})_2-$, $-(Si(R^{33})_2O)_{m'}-Si(R^{33})_2-$, $-CONR^{34}-$, $-O-CONR^{34}-$, $-NR^{34}-$, and $-(CH_2)_n-$;

$R^{33}$s are each individually a phenyl group, a $C_{1-6}$ alkyl group, or a $C_{1-6}$ alkoxy group, preferably a phenyl group or a $C_{1-6}$ alkyl group, more preferably a methyl group;

$R^{34}$s are each individually a hydrogen atom, a phenyl group, or a $C_{1-6}$ alkyl group (preferably a methyl group);

m's are each individually an integer of 1 to 100, preferably an integer of 1 to 20;

n's are each individually an integer of 1 to 20, preferably an integer of 1 to 6, more preferably an integer of 1 to 3;

l' is an integer of 1 to 10, preferably an integer of 1 to 5, more preferably an integer of 1 to 3;

p' is 0, 1, or 2;

q' is 0 or 1; and at least one of p' or q' is 1 and the parenthesized repeating units with the respective subscripts p' and q' may be present in any order.

In the formula, $R^{31}$ and $X^a$ may be substituted by (typically, hydrogen atoms in $R^{31}$ and $X^a$ may be replaced by) one or more substituents selected from a fluorine atom, a $C_{1-3}$ alkyl group, and a $C_{1-3}$ fluoroalkyl group.

$X^1$ is preferably $-(R^{31})_{p'}-(X^a)_{q'}-R^{32}-$. In the formula, $R^{32}$ is a single bond, $-(CH_2)_{t'}-$, or an o-, m-, or p-phenylene group, preferably $-(CH_2)_{t'}-$; and t' is an integer of 1 to 20, preferably an integer of 2 to 6, more preferably an integer of 2 and 3. In the formula, $R^{32}$ may be substituted by (typically, hydrogen atoms in $R^{32}$ may be replaced by) one or more substituents selected from a fluorine atom, a $C_{1-3}$ alkyl group, and a $C_{1-3}$ fluoroalkyl group.

$X^1$ may preferably be a $C_{1-20}$ alkylene group, $-R^{31}-X^c-R^{32}-$, or $-X^d-R^{32}-$, wherein $R^{31}$ and $R^{32}$ are defined in the same manner as mentioned above.

$X^1$ is more preferably a $C_{1-20}$ alkylene group, $-(CH_2)_{s'}-X^c-$, $-(CH_2)_{s'}-X^c-(CH_2)_{t'}-$, $-X^d-$, or $-X^d-(CH_2)_{t'}-$, wherein s' and t' are defined in the same manner as mentioned above.

In the formula, $X^c$ is $-O-$, $-S-$, $-C(O)O-$, $-CONR^{34}-$, $-O-CONR^{34}-$, $-Si(R^{33})_2-$, $-(Si(R^{33})_2O)_{m'}-Si(R^{33})_2-$, $-O-(CH_2)_{u'}-(Si(R^{33})_2O)_{m'}-Si(R^{33})_2-$, $-O-(CH_2)_{u'}-Si(R^{33})_2-O-Si(R^{33})_2-CH_2CH_2-Si(R^{33})_2-O-Si(R^{33})_2-$, $-O-(CH_2)_{u'}-Si(OCH_3)_2OSi(OCH_3)_2-$, $-CONR^{34}-(CH_2)_{u'}-(Si(R^{33})_2O)_{m'}-Si(R^{33})_2-$, $-CONR^{34}-(CH_2)_{u'}-N(R^{34})-$, or $-CONR^{34}$-(o-, m-, or p-phenylene)-$Si(R^{33})_2-$.

In the formula, $R^{33}$, $R^{34}$, and m' are defined in the same manner as mentioned above; and u' is an integer of 1 to 20, preferably an integer of 2 to 6, more preferably an integer of 2 and 3. $X^c$ is preferably $-O-$.

In the formula, $X^d$ is
—S—,
—C(O)O—,
—CONR$^{34}$—,
—CONR$^{34}$—(CH$_2$)$_{u'}$—(Si(R$^{33}$)$_2$O)$_{m'}$—Si(R$^{33}$)$_2$—,
—CONR$^{34}$—(CH$_2$)$_{u'}$—N(R$^{34}$)—, or
—CONR$^{34}$-(o-, m-, or p-phenylene)-Si(R$^{33}$)$_2$—,
wherein the symbols are defined in the same manner as mentioned above.

$X^1$ may more preferably be
a C$_{1-20}$ alkylene group,
—(CH$_2$)$_s$—X$^c$—(CH$_2$)$_{t'}$—, or
—X$^d$—(CH$_2$)$_{t'}$—,
wherein the symbols are defined in the same manner as mentioned above.

$X^1$ is still more preferably
a C$_{1-20}$ alkylene group,
—(CH$_2$)$_s$—O—(CH$_2$)$_{t'}$—,
—(CH$_2$)$_s$—(Si(R$^{33}$)$_2$O)$_{m'}$—Si(R$^{33}$)$_2$—(CH$_2$)$_{t'}$—,
—(CH$_2$)$_s$—O—(CH$_2$)$_{u'}$—(Si(R$^{33}$)$_2$O)$_{m'}$—Si(R$^{33}$)$_2$—(CH$_2$)$_{t'}$—, or
—(CH$_2$)$_s$—O—(CH$_2$)$_{t'}$—Si(R$^{33}$)$_2$—(CH$_2$)$_{u'}$—Si(R$^{33}$)$_2$—(C$_v$H$_{2v}$)—,
wherein R$^{33}$, m', s', t', and u' are defined in the same manner as mentioned above; and v is an integer of 1 to 20, preferably an integer of 2 to 6, more preferably an integer of 2 or 3.

In the formula, —(C$_v$H$_{2v}$)— may be either linear or branched, and may be —CH$_2$CH$_2$—, —CH$_2$CH$_2$CH$_2$—, —CH(CH$_3$)—, and —CH(CH$_3$)CH$_2$—.

The $X^1$ group may be substituted by one or more substituents selected from a fluorine atom, a C$_{1-3}$ alkyl group, and a C$_{1-3}$ fluoroalkyl group (preferably, a C$_{1-3}$ perfluoroalkyl group).

In another embodiment, examples of the $X^1$ group include the following groups.

[Chem. 4]

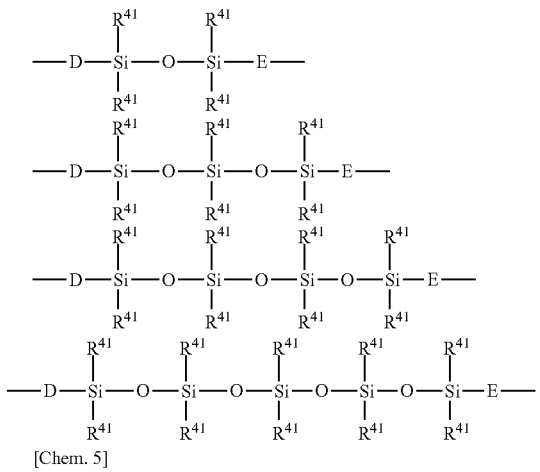

[Chem. 5]

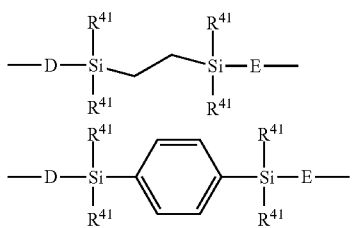

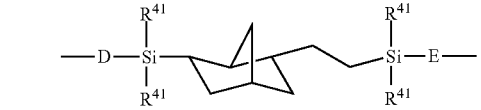

In the formulae, R$^{41}$s are each individually a hydrogen atom, a phenyl group, a C1-C6 alkyl group, or a C$_{1-6}$ alkoxy group, preferably a methyl group;

D is a group selected from
—CH$_2$O(CH$_2$)$_2$—,
—CH$_2$O(CH$_2$)$_3$—,
—CF$_2$O(CH$_2$)$_3$—,
—(CH$_2$)$_2$—,
—(CH$_2$)$_3$—,
—(CH$_2$)$_4$—,
—CONH—(CH$_2$)$_3$—,
—CON(CH$_3$)—(CH$_2$)$_3$—,
—CON(Ph)-(CH$_2$)$_3$— (wherein Ph is phenyl), and

[Chem. 6]

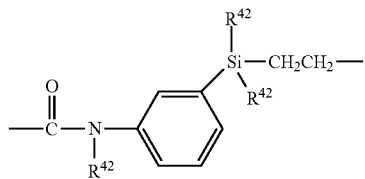

(wherein R$^{42}$s are each individually a hydrogen atom, a C$_{1-6}$ alkyl group, or a C$_{1-6}$ alkoxy group, preferably a methyl group or a methoxy group, more preferably a methyl group);

E is —(CH$_2$)$_n$— (wherein n is an integer of 2 to 6); and
D bonds to PFPE in the molecular main chain and E bonds to the group opposite to PFPE.

Specific examples of $X^1$ include:
—CH$_2$O(CH$_2$)$_2$—,
—CH$_2$O(CH$_2$)$_3$—,
—CH$_2$O(CH$_2$)$_6$—,
—CH$_2$O(CH$_2$)$_3$Si(CH$_3$)$_2$OSi(CH$_3$)$_2$(CH$_2$)$_2$—,
—CH$_2$O(CH$_2$)$_3$Si(CH$_3$)$_2$OSi(CH$_3$)$_2$OSi(CH$_3$)$_2$(CH$_2$)$_2$—,
—CH$_2$O(CH$_2$)$_3$Si(CH$_3$)$_2$O(Si(CH$_3$)$_2$O)$_2$Si(CH$_3$)$_2$(CH$_2$)$_2$—,
—CH$_2$O(CH$_2$)$_3$Si(CH$_3$)$_2$O(Si(CH$_3$)$_2$O)$_3$Si(CH$_3$)$_2$(CH$_2$)$_2$—,
—CH$_2$O(CH$_2$)$_3$Si(CH$_3$)$_2$O(Si(CH$_3$)$_2$O)$_{10}$Si(CH$_3$)$_2$(CH$_2$)$_2$—,
—CH$_2$O(CH$_2$)$_3$Si(CH$_3$)$_2$O(Si(CH$_3$)$_2$O)$_{20}$Si(CH$_3$)$_2$(CH$_2$)$_2$—,
—CH$_2$OCF$_2$CHFOCF$_2$—,
—CH$_2$OCF$_2$CHFOCF$_2$CF$_2$—,
—CH$_2$OCF$_2$CHFOCF$_2$CF$_2$CF$_2$—,
—CH$_2$OCH$_2$CF$_2$CF$_2$OCF$_2$—,
—CH$_2$OCH$_2$CF$_2$CF$_2$OCF$_2$CF$_2$—,
—CH$_2$OCH$_2$CF$_2$CF$_2$OCF$_2$CF$_2$CF$_2$—,
—CH$_2$OCH$_2$CF$_2$CF$_2$OCF(CF$_3$)CF$_2$OCF$_2$—,
—CH$_2$OCH$_2$CF$_2$CF$_2$OCF(CF$_3$)CF$_2$OCF$_2$CF$_2$—,
—CH$_2$OCH$_2$CF$_2$CF$_2$OCF(CF$_3$)CF$_2$OCF$_2$CF$_2$CF$_2$—,
—CH$_2$OCH$_2$CHFCF$_2$OCF$_2$—,
—CH$_2$OCH$_2$CHFCF$_2$OCF$_2$CF$_2$—,
—CH$_2$OCH$_2$CHFCF$_2$OCF$_2$CF$_2$CF$_2$—,
—CH$_2$OCH$_2$CHFCF$_2$OCF(CF$_3$)CF$_2$OCF$_2$—,
—CH$_2$OCH$_2$CHFCF$_2$OCF(CF$_3$)CF$_2$OCF$_2$CF$_2$—,
—CH$_2$OCH$_2$CHFCF$_2$OCF(CF$_3$)CF$_2$OCF$_2$CF$_2$CF$_2$—, —CH₂OCH₂(CH₂)₇CH₂Si(OCH₃)₂OSi(OCH₃)₂(CH₂)₂Si(OCH₃)(OCH₃)₂(CH₂)₂—,
—CH₂OCH₂CH₂CH₂Si(OCH₃)₂OSi(OCH₃)₂(CH₂)₃—,
—CH₂OCH₂CH₂CH₂Si(OCH₂CH₃)₂OSi(OCH₂CH₃)₂(CH₂)—,
—CH₂OCH₂CH₂CH₂Si(OCH₃)₂OSi(OCH₃)₂(CH₂)₂—,
—CH₂OCH₂CH₂CH₂Si(OCH₂CH₃)₂OSi(OCH₂CH₃)₂(CH₂)₂—,
—(CH₂)₂—,
—(CH₂)₃—,
—(CH₂)₄—,
—(CH₂)₅—,
—(CH₂)₆—,
—(CH₂)₂—Si(CH₃)₂—(CH₂)₂—,
—CONH—(CH₂)₃—,
—CON(CH₃)—(CH₂)₃—,
—CON(Ph)-(CH₂)₃— (wherein Ph is phenyl),
—CONH—(CH₂)₆—,
—CON(CH₃)—(CH₂)₆—,
—CON(Ph)-(CH₂)₆— (wherein Ph is phenyl),
—CONH—(CH₂)₂NH(CH₂)₃—,
—CONH—(CH₂)₆NH(CH₂)₃—,
—CH₂O—CONH—(CH₂)₃—,
—CH₂O—CONH—(CH₂)₆—,
—S—(CH₂)₃—,
—(CH₂)₂S(CH₂)₃—,
—CONH—(CH₂)₃Si(CH₃)₂OSi(CH₃)₂(CH₂)₂—,
—CONH—(CH₂)₃Si(CH₃)₂OSi(CH₃)₂OSi(CH₃)₂(CH₂)₂—,
—CONH—(CH₂)₃Si(C₃)₂O(Si(CH₃)₂O)₂Si(CH₃)₂(CH₂)₂—,
—CONH—(CH₂)₃Si(C₃)₂O(Si(CH₃)₂O)₃Si(CH₃)₂(CH₂)₂—,
—CONH—(CH₂)₃Si(CH₃)₂O(Si(CH₃)₂O)₁₀Si(CH₃)₂(CH₂)₂—,
—CONH—(CH₂)₃Si(CH₃)₂O(Si(CH₃)₂O)₂₀Si(CH₃)₂(CH₂)₂—,
—C(O)O—(CH₂)₃—,
—C(O)O—(CH₂)₆—,
—CH₂—O—(CH₂)₃—Si(CH₃)₂—(CH₂)₂—Si(CH₃)₂—(CH₂)₂—,
—CH₂—O—(CH₂)₃—Si(CH₃)₂—(CH₂)₂—Si(CH₃)₂—CH(CH₃)—,
—CH₂—O—(CH₂)₃—Si(CH₃)₂—(CH₂)₂—Si(CH₃)₂—(CH₂)₃—,
—CH₂—O—(CH₂)₃—Si(CH₃)₂—(CH₂)₂—Si(CH₃)₂—CH(CH₃)—CH₂—,
—OCH₂—,
—O(CH₂)₃—,
—OCFHCF₂—, and
groups represented by the following formulae.

[Chem. 7]

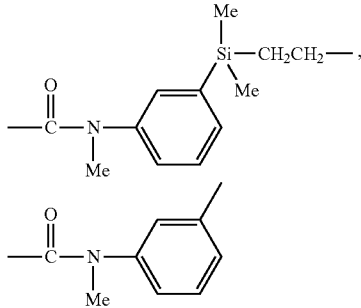

In still another embodiment, $X^1$ is a group represented by the formula: $—(R^{16})_x—(CFR^{17})_y—(CH_2)_z—$. In the formula, x, y, and z are each individually an integer of 0 to 10; the sum of x, y, and z is 1 or greater; and the parenthesized repeating units may be present in any order in the formula.

In the formula, $R^{16}$s are each individually an oxygen atom, phenylene, carbazolylene, $—NR^{26}—$ (wherein $R^{26}$ is a hydrogen atom or an organic group), or a divalent organic group. $R^{16}$ is preferably an oxygen atom or a divalent polar group.

Examples of the "divalent polar group" include, but are not limited to, $—C(O)—$, $—C(=NR^{27})—$, and $—C(O)NR^{27}—$ (wherein $R^{27}$ is a hydrogen atom or a lower alkyl group). The "lower alkyl group" may be a C1-C6 alkyl group, such as methyl, ethyl, or n-propyl, and may be substituted by one or more fluorine atoms.

In the formula, $R^{17}$s are each individually a hydrogen atom, a fluorine atom, or a lower fluoroalkyl group, preferably a fluorine atom. The "lower fluoroalkyl group" may be a C1-C6, preferably C1-C3, fluoroalkyl group, preferably a C1-C3 perfluoroalkyl group, more preferably a trifluoromethyl group or a pentafluoroethyl group, still more preferably a trifluoromethyl group.

In this embodiment, $X^1$ is preferably a group represented by the formula: $—(O)_x—(CF_2)_y—(CH_2)_z—$, wherein x, y, and z are defined in the same manner as mentioned above; and the parenthesized repeating units may be present in any order in the formula.

Examples of the group represented by the formula: $—(O)_x—(CF_2)_y—(CH_2)_z—$ include $—(O)_{x'}—(CH_2)_{z''}—O—[(CH_2)_{z'''}—O—]_{z''''}$ and $—(O)_{x'}—(CF_2)_{y''}—(CH_2)_{z''}—O—[(CH_2)_{z'''}—O—]_{z''''}$ (wherein x' is 0 or 1; y", z", and z''' are each individually an integer of 1 to 10; and z'''' is 0 or 1). These groups bond to the PFPE side at the left end thereof.

In a preferred embodiment, $X^1$ is $—O—CFR^3—(CF_2)_e—$.

$R^{13}$s are each individually a fluorine atom or a lower fluoroalkyl group. The lower fluoroalkyl group may be a C1-C3 fluoroalkyl group, preferably a C1-C3 perfluoroalkyl group, more preferably a trifluoromethyl group or pentafluoroethyl group, still more preferably a trifluoromethyl group.

In the formula, es are each individually 0 or 1.

In one specific example, $R^{13}$ is a fluorine atom and e is 1.

In still another embodiment, examples of the $X^1$ group include the following groups:

[Chem. 8]

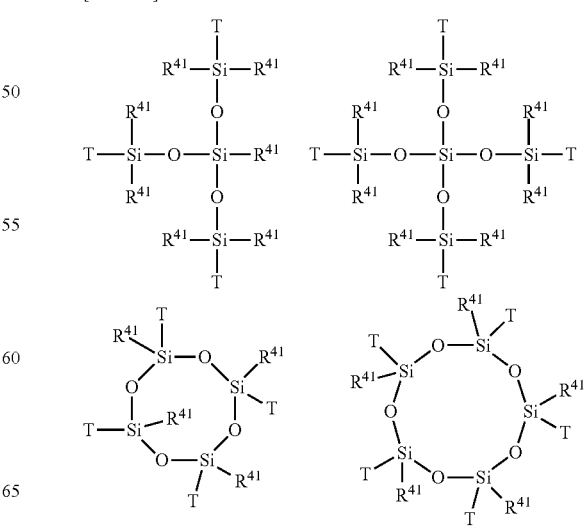

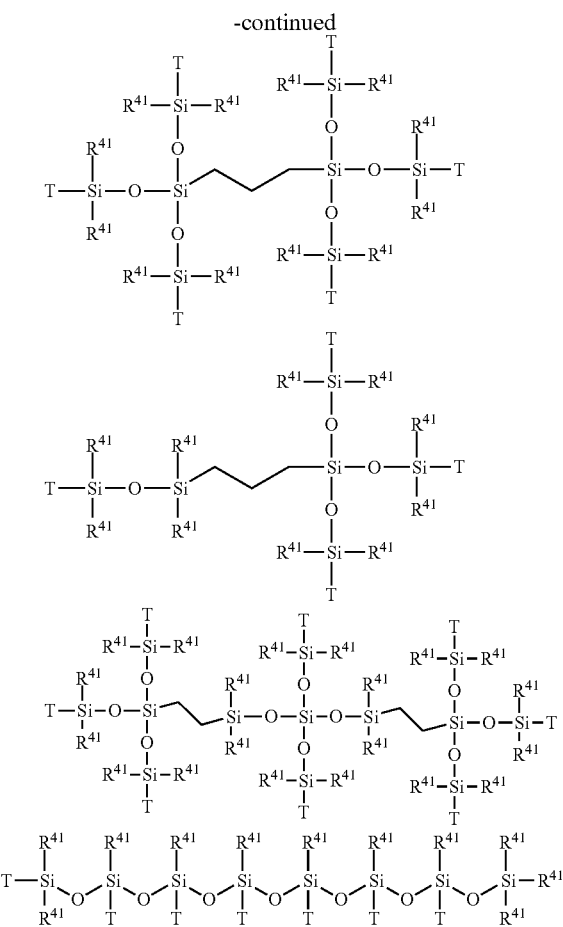

wherein
R$^{41}$s are each individually a hydrogen atom, a phenyl group, a C1-C6 alkyl group, or a C$_{1-6}$ alkoxy group,
in each X$^1$ group, some of Ts are each any of the following groups bonding to PFPE in the molecular main chain:
—CH$_2$O(CH$_2$)$_2$—,
—CH$_2$O(CH$_2$)$_3$—,
—CF$_2$O(CH$_2$)$_3$—,
—(CH$_2$)$_2$—,
—(CH$_2$)$_3$—,
—(CH$_2$)$_4$—,
—CONH—(CH$_2$)$_3$—,
—CON(CH$_3$)—(CH$_2$)$_3$—,
—CON(Ph)-(CH$_2$)$_3$— (wherein Ph is phenyl), or

[Chem. 9]

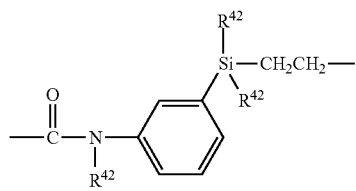

(wherein R$^{42}$s are each individually a hydrogen atom, a C$_{1-6}$ alkyl group, or a C$_{1-6}$ alkoxy group, preferably a methyl group or a methoxy group, more preferably a methyl group),
some of the other Ts are —(CH$_2$)$_{n''}$— (wherein n" is an integer of 2 to 6) bonding to the group opposite to PFPE in the molecular main chain (i.e., the carbon atom in the formulae (A1), (A2), (D1), and (D2), or the Si atom in the formulae (B1), (B2), (C1), and (C2) mentioned below), and
the other Ts, if present, may be each individually a methyl group, a phenyl group, a C$_{1-6}$ alkoxy group, a radical scavenging group, or an ultraviolet absorbing group.

The radical scavenging group may be any group capable of scavenging radicals generated by light irradiation, and examples thereof include the residues of benzophenones, benzotriazoles, benzoic acid esters, phenyl salicylates, crotonic acids, malonic acid esters, organoacrylates, hindered amines, hindered phenols, and triazines.

The ultraviolet absorbing group may be any groups capable of absorbing ultraviolet rays, and examples thereof include the residues of benzotriazoles, hydroxybenzophenones, esters of substituted or unsubstituted benzoic acid or salicylic acid compounds, acrylates or alkoxycinnamates, oxamides, oxanilides, benzoxazinones, and benzoxazoles.

In a preferred embodiment, preferred examples of the radical scavenging group or the ultraviolet absorbing group include:

[Chem. 10]

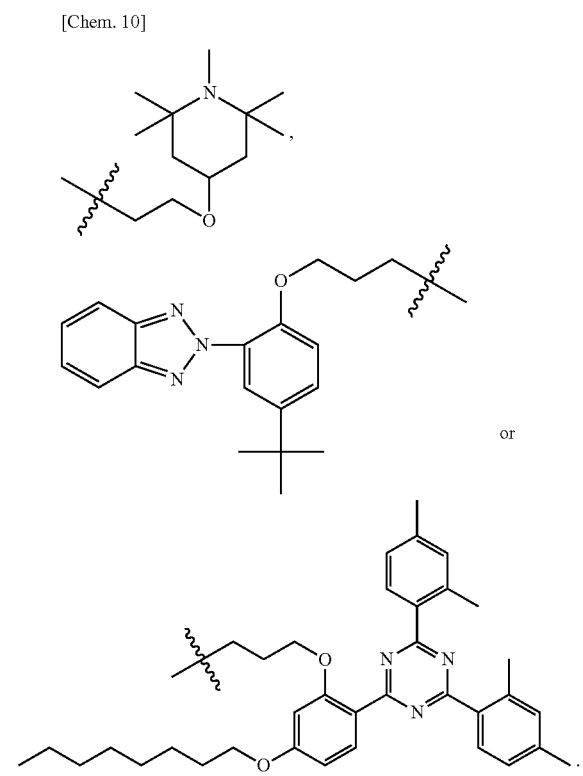 [SMILES: *CCOC1CC(C)(C)N(C)C(C)(C)C1 ; *CCCOc1ccc(C(C)(C)C)cc1-n1nc2ccccc2n1 ; *CCCOc1cc(OCCCCCCCC)ccc1-c1nc(-c2ccc(C)cc2C)nc(-c2ccc(C)cc2C)n1]

In this embodiment, X$^1$s may each be individually a trivalent to decavalent organic group.

In the formulae, ts are each individually an integer of 1 to 10. In a preferred embodiment, t is an integer of 1 to 6. In another preferred embodiment, t is an integer of 2 to 10, preferably an integer of 2 to 6.

In the formulae, X$^2$s are each individually a single bond or a divalent organic group. X$^2$ is preferably a C1-C20 alkylene group, more preferably —(CH$_2$)$_u$—, wherein u is an integer of 0 to 2.

Preferred as the compounds represented by any of the formulae (A1) and (A2) are compounds respectively represented by the following formulae (A1') and (A2'):

[Chem. 11]

$$Rf-PFPE-X^1-(CH_2C)_t-R^{11} \atop {R^{12} \atop X^2-SiR^1{}_{n1}R^2{}_{3-n1}}} \quad (A1')$$

$$R^{11}-(CCH_2)_t-X^1-PFPE-X^1-(CH_2C)_t-R^{11} \atop {R^{12} \qquad\qquad R^{12} \atop R^2{}_{3-n1}R^1{}_{n1}Si-X^2 \qquad X^2-SiR^1{}_{n1}R^2{}_{3-n1}}} \quad (A2')$$

wherein
PFPEs are each individually a group represented by the formula:

$$-(OC_4F_8)_a-(OC_3F_6)_b-(OC_2F_4)_c-(OCF_2)_d-$$

(wherein a, b, c, and d are each individually an integer of 0 to 200, the sum of a, b, c, and d is at least 1, and the parenthesized repeating units with the respective subscripts a, b, c, and d may be present in any order in the formula);
Rfs are each individually a C1-C16 alkyl group optionally substituted by one or more fluorine atoms;
$R^1$s are each individually a hydrolyzable group;
$R^2$s are each individually a hydrogen atom or a C1-C22 alkyl group;
$R^{11}$s are each individually a hydrogen atom or a halogen atom;
$R^{12}$s are each individually a hydrogen atom or a lower alkyl group;
$n1$ is an integer of 1 to 3, preferably 3;
$X^1$ is $-O-CFR^{13}-(CF_2)_e-$;
$R^{13}$ is a fluorine atom or a lower fluoroalkyl group;
$e$ is 0 or 1;
$X^2$ is $-(CH_2)_u-$;
$u$ is an integer of 0 to 2 (when u is 0, $X^2$ is a single bond); and
$t$ is an integer of 1 to 10.

The compounds represented by any of the formulae (A1) and (A2) can be obtained by preparing a perfluoropolyether derivative which corresponds to the Rf-PFPE-moiety as a starting material, introducing iodine to an end, and then allowing a vinyl monomer which corresponds to $-CH_2CR^{12}(X^2-SiR^1{}_{n1}R^2{}_{3-n1})-$ to react therewith.

The formulae (B1) and (B2) are as follows.

[Chem. 12]

$$(Rf-PFPE)_{\beta'}-X^5-(SiR^1{}_{n1}R^2{}_{3-n1})_\beta \quad (B1)$$

$$(R^2{}_{3-n1}R^1{}_{n1}Si)_\beta-X^5-PFPE-X^5-(SiR^1{}_{n1}R^2{}_{3-n1})_\beta \quad (B2)$$

In the formulae (B1) and (B2), Rf, PFPE, $R^1$, $R^2$, and $n1$ are defined in the same manner as in the formulae (A1) and (A2).

In the formulae, $X^5$s are each individually a single bond or a divalent to decavalent organic group. This $X^5$ is understood as a linker that couples a perfluoropolyether moiety (i.e., Rf-PFPE moiety or -PFPE-moiety) mainly providing properties such as water repellency and surface smoothness and a silane moiety (specifically, $-SiR^1{}_{n1}R^2{}_{3-n1}$) providing the adhesiveness to a substrate in the compounds represented by the formulae (B1) and (B2). Thus, the $X^5$ may be any organic group that allows the compounds represented by the formulae (B1) and (B2) to be present stably.

In the formulae, $\beta$ is an integer of 1 to 9 and $\beta'$ is an integer of 1 to 9. These $\beta$ and $\beta'$ are determined in accordance with the valence of $X^5$. In the formula (B1), the sum of $\beta$ and $\beta'$ is the same as the valence of $X^5$. For example, when $X^5$ is a decavalent organic group, the sum of $\beta$ and $\beta'$ is 10, where $\beta$ is 9 and $\beta'$ is 1, $\beta$ is 5 and $\beta'$ is 5, or $\beta$ is 1 and $\beta'$ is 9, for example. When $X^5$ is a divalent organic group, $\beta$ and $\beta'$ are both 1. In the formula (B2), 3 is a value obtained by subtracting 1 from the valence of $X^5$.

$X^5$ is preferably a divalent to heptavalent, more preferably divalent to tetravalent, still more preferably divalent organic group.

In an embodiment, $X^5$ is a divalent to tetravalent organic group, $\beta$ is 1 to 3, and $\beta'$ is 1.

In another embodiment, $X^5$ is a divalent organic group, $\beta$ is 1, and $\beta'$ is 1. In this embodiment, the formulae (B1) and (B2) are represented by the following formulae (B1') and (B2').

[Chem. 13]

$$Rf-PFPE-X^5-SiR^1{}_{n1}R^2{}_{3-n1} \quad (B1')$$

$$R^2{}_{3-n1}R^1{}_{n1}Si-X^5-PFPE-X^5-SiR^1{}_{n1}R^2{}_{3-n1} \quad (B2')$$

Examples of $X^5$ are, but not limited to, the same as those mentioned for $X^1$.
Preferred specific examples of $X^5$ among these include:
$-CH_2O(CH_2)_2-$,
$-CH_2O(CH_2)_3-$,
$-CH_2O(CH_2)_6-$,
$-CH_2O(CH_2)_3Si(CH_3)_2OSi(CH_3)_2(CH_2)_2-$,
$-CH_2O(CH_2)_3Si(CH_3)_2OSi(CH_3)_2OSi(CH_3)_2(CH_2)_2-$,
$-CH_2O(CH_2)_3Si(CH_3)_2O(Si(CH_3)_2O)_2Si(CH_3)_2(CH_2)_2-$,
$-CH_2O(CH_2)_3Si(CH_3)_2O(Si(CH_3)_2O)_3Si(CH_3)_2(CH_2)_2-$,
$-CH_2O(CH_2)_3Si(CH_3)_2O(Si(CH_3)_2O)_{10}Si(CH_3)_2(CH_2)_2-$,
$-CH_2O(CH_2)_3Si(CH_3)_2O(Si(CH_3)_2O)_{20}Si(CH_3)_2(CH_2)_2-$,
$-CH_2OCF_2CHFOCF_2-$,
$-CH_2OCF_2CHFOCF_2CF_2-$,
$-CH_2OCF_2CHFOCF_2CF_2CF_2-$,
$-CH_2OCH_2CF_2CF_2OCF_2-$,
$-CH_2OCH_2CF_2CF_2OCF_2CF_2-$,
$-CH_2OCH_2CF_2CF_2OCF_2CF_2CF_2-$,
$-CH_2OCH_2CF_2CF_2OCF(CF_3)CF_2OCF_2-$,
$-CH_2OCH_2CF_2CF_2OCF(CF_3)CF_2OCF_2CF_2-$,
$-CH_2OCH_2CF_2CF_2OCF(CF_3)CF_2OCF_2CF_2CF_2-$,
$-CH_2OCH_2CHFCF_2OCF_2-$,
$-CH_2OCH_2CHFCF_2OCF_2CF_2-$,
$-CH_2OCH_2CHFCF_2OCF_2CF_2CF_2-$,
$-CH_2OCH_2CHFCF_2OCF(CF_3)CF_2OCF_2-$,
$-CH_2OCH_2CHFCF_2OCF(CF_3)CF_2OCF_2CF_2-$,
$-CH_2OCH_2CHFCF_2OCF(CF_3)CF_2OCF_2CF_2CF_2-$,
$-CH_2OCH_2(CH_2)_7CH_2Si(OCH_3)_2OSi(OCH_3)_2(CH_2)_2Si(OCH_3)_2OSi(OCH_3)_2(CH_2)_2-$,
$-CH_2OCH_2CH_2CH_2Si(OCH_3)_2OSi(OCH_3)_2(CH_2)_3-$,
$-CH_2OCH_2CH_2CH_2Si(OCH_2CH_3)_2OSi(OCH_2CH_3)_2(CH_2)_3-$,
$-CH_2OCH_2CH_2CH_2Si(OCH_3)_2OSi(OCH_3)_2(CH_2)_2-$,
$-CH_2OCH_2CH_2CH_2Si(OCH_2CH_3)_2OSi(OCH_2CH_3)_2(CH_2)_2-$,
$-(CH_2)_2-$,
$-(CH_2)_3-$,
$-(CH_2)_4-$,
$-(CH_2)_5-$, —(CH$_2$)$_6$—,
—(CH$_2$)$_2$—Si(CH$_3$)$_2$—(CH$_2$)$_2$—,
—CONH—(CH$_2$)$_3$—,
—CON(CH$_3$)—(CH$_2$)$_3$—,
—CON(Ph)-(CH$_2$)$_3$— (wherein Ph is phenyl),
—CONH—(CH$_2$)$_6$—,
—CON(CH$_3$)—(CH$_2$)$_6$—,
—CON(Ph)-(CH$_2$)$_6$— (wherein Ph is phenyl),
—CONH—(CH$_2$)$_2$NH(CH$_2$)$_3$—,
—CONH—(CH$_2$)$_6$NH(CH$_2$)$_3$—,
—CH$_2$O—CONH—(CH$_2$)$_3$—,
—CH$_2$O—CONH—(CH$_2$)$_6$—,
—S—(CH$_2$)$_3$—,
(CH$_2$)$_2$S(CH$_2$)$_3$—,
—CONH—(CH$_2$)$_3$Si(CH$_3$)$_2$OSi(CH$_3$)$_2$(CH$_2$)$_2$—,
—CONH—(CH$_2$)$_3$Si(CH$_3$)$_2$OSi(CH$_3$)$_2$OSi(CH$_3$)$_2$(CH$_2$)$_2$—,
—CONH—(CH$_2$)$_3$Si(CH$_3$)$_2$O(Si(CH$_3$)$_2$O)$_2$Si(CH$_3$)$_2$(CH$_2$)$_2$—,
—CONH—(CH$_2$)$_3$Si(CH$_3$)$_2$O(Si(CH$_3$)$_2$O)$_3$Si(CH$_3$)$_2$(CH$_2$)$_2$—,
—CONH—(CH$_2$)$_3$Si(CH$_3$)$_2$O(Si(CH$_3$)$_2$O)$_{10}$Si(CH$_3$)$_2$(CH$_2$)$_2$—,
—CONH—(CH$_2$)$_3$Si(CH$_3$)$_2$O(Si(CH$_3$)$_2$O)$_{20}$Si(CH$_3$)$_2$(CH$_2$)$_2$—,
—C(O)O—(CH$_2$)$_3$—,
—C(O)O—(CH$_2$)$_6$—,
—CH$_2$—O—(CH$_2$)$_3$—Si(CH$_3$)$_2$—(CH$_2$)$_2$—Si(CH$_3$)$_2$—(CH$_2$)$_2$—,
—CH$_2$—O—(CH$_2$)$_3$—Si(CH$_3$)$_2$—(CH$_2$)$_2$—Si(CH$_3$)$_2$—CH(CH$_3$)—,
—CH$_2$—O—(CH$_2$)$_3$—Si(CH$_3$)$_2$—(CH$_2$)$_2$—Si(CH$_3$)$_2$—(CH$_2$)$_3$—,
—CH$_2$—O—(CH$_2$)$_3$—Si(CH$_3$)$_2$—(CH$_2$)$_2$—Si(CH$_3$)$_2$—CH(CH$_3$)—CH$_2$—,
—OCH$_2$—,
—O(CH$_2$)$_3$—,
—OCFHCF$_2$—, and
groups represented by the following formulae.

[Chem. 14]

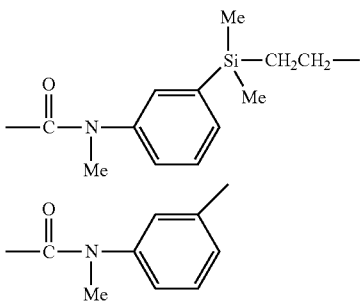

Preferred as the compounds represented by any of the formulae (B1) and (B2) are compounds respectively represented by the following formulae (B1') and (B2'):

[Chem. 15]

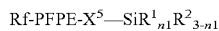

(B1')

(B2')

wherein
PFPEs are each individually a group represented by the formula:

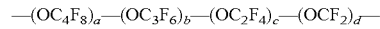

(wherein a, b, c, and d are each individually an integer of 0 to 200, the sum of a, b, c, and d is at least 1, and the parenthesized repeating units with the respective subscripts a, b, c, and d may be present in any order in the formula);
Rfs are each individually a C1-C16 alkyl group optionally substituted by one or more fluorine atoms;
R$^1$s are each individually a hydrolyzable group;
R$^2$s are each individually a hydrogen atom or a C1-C22 alkyl group;
n1 is an integer of 1 to 3, preferably 3; and
X$^5$ is —CH$_2$O(CH$_2$)$_2$—, —CH$_2$O(CH$_2$)$_3$—, or —CH$_2$O(CH$_2$)$_6$—.

The compounds represented by any of the formulae (B1) and (B2) can be produced by a known method, such as the method disclosed in Patent Literature 1 or a modified method thereof. For example, the compounds represented by any of the formulae (B1) and (B2) can be obtained as follows. Specifically, a compound represented by the following formula (B1-4) or (B2-4):

[Chem. 16]

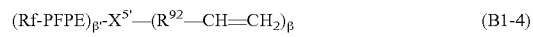 (B1-4)

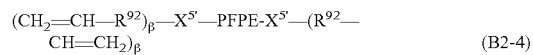 (B2-4)

(wherein
PFPEs are each individually a group represented by the formula:

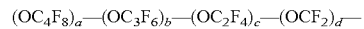

(wherein a, b, c, and d are each individually an integer of 0 to 200, the sum of a, b, c, and d is at least 1, and the parenthesized repeating units with the respective subscripts a, b, c, and d may be present in any order in the formula);
Rfs are each individually a C1-C16 alkyl group optionally substituted by one or more fluorine atoms;
X$^5$'s are each individually a single bond or a divalent to decavalent organic group;
βs are each individually an integer of 1 to 9;
β's are each individually an integer of 1 to 9; and
R$^{92}$ is a single bond or a divalent organic group) is reacted with HSiM$_3$ (wherein Ms are each individually a halogen atom, R$^1$, or R$^2$; R$^1$s are each individually a hydrolyzable group; and R$^2$s are each individually a hydrogen atom or a C1-C22 alkyl group), and if necessary the optional halogen atom(s) is/are converted into R$^1$ or R$^2$ so that a compound represented by the following formula (B1") or (B2"):

[Chem. 17]

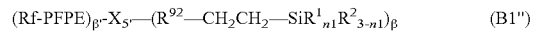 (B1")

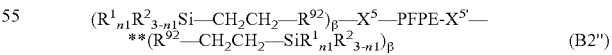 (B2")

(wherein PFPE, Rf, X$^{5'}$, β, β', and R$^{92}$ are defined in the same manner as mentioned above; and n1 is an integer of 0 to 3) is obtained as the compound represented by the formula (B1) or (B2).

In the formulae (B1") or (B2"), the portion from X$^{5'}$ to R$^{92}$—CH$_2$CH$_2$— corresponds to X$^5$ in the formula (B1) or (B2)

The formulae (C1) and (C2) are as follows.

[Chem. 18]

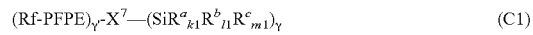 (C1)

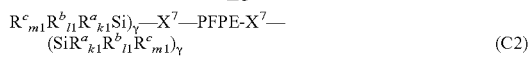

$$R^c{}_{m1}R^b{}_{l1}R^a{}_{k1}Si)_{\gamma'}-X^7-PFPE-X^7-$$
$$(SiR^a{}_{k1}R^b{}_{l1}R^c{}_{m1})_\gamma \quad (C2)$$

In the formulae (C1) and (C2), Rf and PFPE are defined in the same manner as in the formulae (A1) and (A2)

In the formulae, $X^7$s are each individually a single bond or a divalent to decavalent organic group. This $X^7$ is understood as a linker that couples a perfluoropolyether moiety (i.e., Rf-PFPE moiety or -PFPE-moiety) mainly providing properties such as water repellency and surface smoothness and a silane moiety (specifically, $—SiR^a{}_{k1}R^b{}_{l1}R^c{}_{m1}$) providing the adhesiveness to a substrate in the compounds represented by the formulae (C1) and (C2). Thus, the $X^7$ may be any organic group that allows the compounds represented by the formulae (C1) and (C2) to be present stably.

In the formulae, γ is an integer of 1 to 9 and γ' is an integer of 1 to 9. These γ and γ' are determined in accordance with the valence of $X^7$. In the formula (C1), the sum of γ and γ' is the same as the valence of $X^7$. For example, when $X^7$ is a decavalent organic group, the sum of γ and γ' is 10, where γ is 9 and γ' is 1, γ is 5 and γ' is 5, or γ is 1 and γ' is 9, for example. When $X^7$ is a divalent organic group, γ and γ' are both 1. In the formula (C1), γ is a value obtained by subtracting 1 from the valence of $X^7$.

$X^7$ is preferably a divalent to heptavalent, more preferably divalent to tetravalent, still more preferably divalent organic group.

In an embodiment, $X^7$ is a divalent to tetravalent organic group, γ is 1 to 3, and γ' is 1.

In another embodiment, $X^7$ is a divalent organic group, γ is 1, and γ' is 1. In this embodiment, the formulae (C1) and (C2) are represented by the following formulae (C1') and (C2').

[Chem. 19]

$$Rf-PFPE-X^7-SiR^a{}_{k1}R^b{}_{l1}R^c{}_{m1} \quad (C1')$$

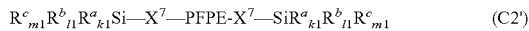

$$R^c{}_{m1}R^b{}_{l1}R^a{}_{k1}Si-X^7-PFPE-X^7-SiR^a{}_{k1}R^b{}_{l1}R^c{}_{m1} \quad (C2')$$

Examples of $X^7$ are, but not limited to, the same as those mentioned for $X^1$.

Preferred specific examples of $X^7$ among these include:
—$CH_2O(CH_2)_2$—,
—$CH_2O(CH_2)_3$—,
—$CH_2O(CH_2)_6$—,
—$CH_2O(CH_2)_3Si(CH_3)_2OSi(CH_3)_2(CH_2)_2$—,
—$CH_2O(CH_2)_3Si(CH_3)_2OSi(CH_3)_2OSi(CH_3)_2(CH_2)_2$—,
—$CH_2O(CH_2)_3Si(CH_3)_2O(Si(CH_3)_2O)_2Si(CH_3)_2(CH_2)_2$—,
—$CH_2O(CH_2)_3Si(CH_3)_2O(Si(CH_3)_2O)_3Si(CH_3)_2(CH_2)_2$—,
—$CH_2O(CH_2)_3Si(CH_3)_2O(Si(CH_3)_2O)_{10}Si(CH_3)_2(CH_2)_2$—,
—$CH_2O(CH_2)_3Si(CH_3)_2O(Si(CH_3)_2O)_{20}Si(CH_3)_2(CH_2)_2$—,
—$CH_2OCF_2CHFOCF_2$—,
—$CH_2OCF_2CHFOCF_2CF_2$—,
—$CH_2OCF_2CHFOCF_2CF_2CF_2$—,
—$CH_2OCH_2CF_2CF_2OCF_2$—,
—$CH_2OCH_2CF_2CF_2OCF_2CF_2$—,
—$CH_2OCH_2CF_2CF_2OCF_2CF_2CF_2$—,
—$CH_2OCH_2CF_2CF_2OCF(CF_3)CF_2OCF_2$—,
—$CH_2OCH_2CF_2CF_2OCF(CF_3)CF_2OCF_2CF_2$—,
—$CH_2OCH_2CF_2CF_2OCF(CF_3)CF_2OCF_2CF_2CF_2$—,
—$CH_2OCH_2CHFCF_2OCF_2$—,
—$CH_2OCH_2CHFCF_2OCF_2CF_2$—,
—$CH_2OCH_2CHFCF_2OCF_2CF_2CF_2$—,
—$CH_2OCH_2CHFCF_2OCF(CF_3)CF_2OCF_2$—,
—$CH_2OCH_2CHFCF_2OCF(CF_3)CF_2OCF_2CF_2$—,
—$CH_2OCH_2CHFCF_2OCF(CF_3)CF_2OCF_2CF_2CF_2$—,
—$CH_2OCH_2(CH_2)_7CH_2Si(OCH_3)_2OSi(OCH_3)_2(CH_2)_2Si(OCH_3)_2OSi(OCH_3)_2(CH_2)_2$—,
—$CH_2OCH_2CH_2CH_2Si(OCH_3)_2OSi(OCH_3)_2(CH_2)_3$—,
—$CH_2OCH_2CH_2CH_2Si(OCH_2CH_3)_2OSi(OCH_2CH_3)_2(CH_2)_3$—,
—$CH_2OCH_2CH_2CH_2Si(OCH_3)_2OSi(OCH_3)_2(CH_2)_2$—,
—$CH_2OCH_2CH_2CH_2Si(OCH_2CH_3)_2OSi(OCH_2CH_3)_2(CH_2)_2$—,
—$(CH_2)_2$—,
—$(CH_2)_3$—,
—$(CH_2)_4$—,
—$(CH_2)_5$—,
—$(CH_2)_6$—,
—$(CH_2)_2$—$Si(CH_3)_2$—$(CH_2)_2$—,
—$CONH$—$(CH_2)_3$—,
—$CON(CH_3)$—$(CH_2)_3$—,
—$CON(Ph)$-$(CH_2)_3$— (wherein Ph is phenyl),
—$CONH$—$(CH_2)_6$—,
—$CON(CH_3)$—$(CH_2)_6$—,
—$CON(Ph)$-$(CH_2)_6$— (wherein Ph is phenyl),
—$CONH$—$(CH_2)_2NH(CH_2)_3$—,
—$CONH$—$(CH_2)_6NH(CH_2)_3$—,
—$CH_2O$—$CONH$—$(CH_2)_3$—,
—$CH_2O$—$CONH$—$(CH_2)_6$—,
—$S$—$(CH_2)_3$—,
—$(CH_2)_2S(CH_2)_3$—,
—$CONH$—$(CH_2)_3Si(CH_3)_2OSi(CH_3)_2(CH_2)_2$—,
—$CONH$—$(CH_2)_3Si(CH_3)_2OSi(CH_3)_2OSi(CH_3)_2(CH_2)_2$—,
—$CONH$—$(CH_2)_3Si(CH_3)_2O(Si(CH_3)_2O)_2Si(CH_3)_2(CH_2)_2$—,
—$CONH$—$(CH_2)_3Si(CH_3)_2O(Si(CH_3)_2O)_3Si(CH_3)_2(CH_2)_2$—,
—$CONH$—$(CH_2)_3Si(CH_3)_2O(Si(CH_3)_2O)_{10}Si(CH_3)_2(CH_2)_2$—,
—$CONH$—$(CH_2)_3Si(CH_3)_2O(Si(CH_3)_2(CH_2)_2$—,
—$C(O)$—$(CH_2)_3$—,
—$C(O)$—$(CH_2)_6$—,
—$CH_2$—$O$—$(CH_2)_3$—$Si(CH_3)_2$—$(CH_2)_2$—$Si(CH_3)_2$—$(CH_2)_2$—,
—$CH_2$—$O$—$(CH_2)_3$—$Si(CH_3)_2$—$(CH_2)_2$—$Si(CH_3)_2$—$CH(CH_3)$—,
—$CH_2$—$O$—$(CH_2)_3$—$Si(CH_3)_2$—$(CH_2)_2$—$Si(CH_3)_2$—$(CH_2)_3$—,
—$CH_2$—$O$—$(CH_2)_3$—$Si(CH_3)_2$—$(CH_2)_2$—$Si(CH_3)_2$—$CH(CH_3)$—$CH_2$—,
—$OCH_2$—,
—$O(CH_2)_3$—,
—$OCFHCF_2$—, and
groups represented by the following formulae.

[Chem. 20]

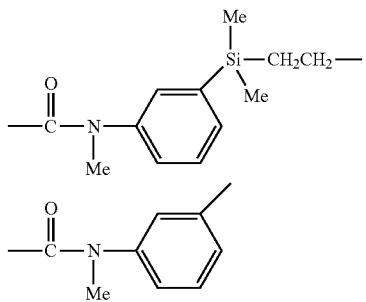

In the formulae, $R^a$s are each individually —$Z^1$—$SiR^{71}_{p1}R^{72}_{q1}R^{73}_{r1}$.

In the formula, $Z^1$s are each individually an oxygen atom or a divalent organic group.

$Z^1$ is preferably a divalent organic group and does not include one forming a siloxane bond with the terminal Si atom (Si atom to which $R^a$ is bonded) in the molecular main chain of the formula (C1) or the formula (C2).

$Z^1$ is preferably a $C_{1-6}$ alkylene group, —$(CH_2)_g$—O—$(CH_2)_h$— (wherein g is an integer of 1 to 6; and h is an integer of 1 to 6), or -phenylene-$(CH_2)_i$— (wherein i is an integer of 0 to 6), more preferably a $C_{1-3}$ alkylene group. These groups may be substituted by one or more substituents selected from a fluorine atom, a $C_{1-6}$ alkyl group, a $C_{2-6}$ alkenyl group, and a $C_{2-6}$ alkynyl group.

In the formula, $R^{71}$s are each individually $R^{a'}$. $R^{a'}$ is defined in the same manner as $R^a$.

The number of Si linearly linked via the $Z^1$ group in $R^a$ is at most five. In other words, when at least one $R^{71}$ is present in $R^a$, there are two or more Si atoms linearly linked via the $Z^1$ group in $R^a$, and the number of Si atoms linearly linked via such a $Z^1$ group is at most five. The "number of Si atoms linearly linked via the $Z^1$ group in $R_a$" is equivalent to the number of repeated —$Z^1$—Si— units linearly linked in $R^a$.

An example of linking of Si atoms via the $Z^1$ group (in the following formula, simply expressed as "Z") in $R^a$ is shown below.

[Chem. 21]

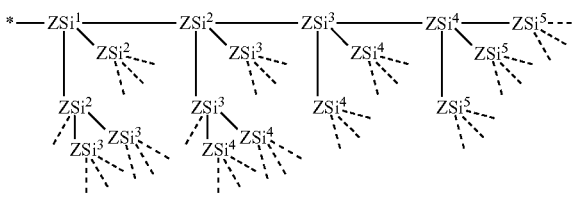

In the formula, the symbol * represents the site bonding to Si in the main chain; and the symbol . . . represents bonding of a predetermined group other than ZSi. In other words, when all of the three bindings of a Si atom are represented by the symbol . . . , it means the site where repeat of ZSi is finished. The superscript immediately after Si is the number of Si atoms linearly linked from the symbol * via the Z group. In other words, when the ZSi repeating is finished at $Si^2$, the chain is considered as including two "Si atoms linearly linked via the $Z^1$ group in $R^{a}$". Similarly, when ZSi repeating is finished at $Si^3$, $Si^4$, and $Si^5$, the chain includes three, four, and five "Si atoms linearly linked via the $Z^1$ group in $R^{a}$", respectively. As is clear from the above formula, a plurality of ZSi chains is present in $R^a$. Still, they need not to be the same length, and may have the respective lengths.

In a preferred embodiment, as shown below, the "number of Si atoms linearly linked via the $Z^1$ group in $R^{a}$" is one (left formula) or two (right formula) in all the chains.

[Chem. 22]

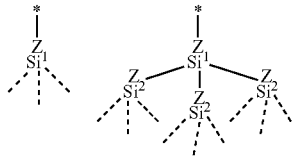

In an embodiment, the number of Si atoms linearly linked via the $Z^1$ group in $R^a$ is one or two, preferably one.

In the formula, $R^{72}$s are each individually a hydrolyzable group.

The "hydrolyzable group" as used herein means a group that may undergo hydrolysis. Examples of the hydrolyzable group include —OR, —OCOR, —O—N=C(R)$_2$, —N(R)$_2$, —NHR, and halogens (wherein R is a substituted or unsubstituted C1-C4 alkyl group). Preferred is —OR (alkoxy group). Examples of the group for R include unsubstituted alkyl groups such as methyl, ethyl, propyl, isopropyl, n-butyl, and isobutyl groups; and substituted alkyl groups such as a chloromethyl group. Preferred among these are alkyl groups, particularly unsubstituted alkyl groups, and more preferred is a methyl group or an ethyl group.

$R^{72}$ is preferably —OR, wherein R is a substituted or unsubstituted $C_{1-3}$ alkyl group, more preferably a methyl group.

In the formula, $R^{73}$s are each individually a hydrogen atom or a lower alkyl group. The lower alkyl group is preferably a C1-C20 alkyl group, more preferably a C1-C6 alkyl group, still more preferably a methyl group.

In the formula, p1s are each individually an integer of 0 to 3; q1s are each individually an integer of 0 to 3; and r1s are each individually an integer of 0 to 3. The sum of p1, q1, and r1 is 3.

In a preferred embodiment, in the terminal $R^{a'}$ (or $R^a$ if $R^{a'}$ is absent) in $R^a$, q1 is preferably 2 or greater, such as 2 or 3, more preferably 3.

In a preferred embodiment, at least one terminal of $R^a$ may be —Si(—$Z^1$—$SiR^{72}_qR^{73}_r$)$_2$ or —Si(—$Z^1$—$SiR^{72}_qR^{73}_r$)$_3$, and may preferably be —Si(—$Z^1$—$SiR^{72}_qR^{73}_r$)$_3$. In the formula, the (—$Z^1$—$SiR^{72}_qR^{73}_r$) unit is preferably (—$Z^1$—$SiR^{72}_3$). In a more preferred embodiment, all the terminals of $R^a$ may be —Si(—$Z^1$—$SiR^{72}_qR^{73}_r$)$_3$, preferably —Si(—$Z^1$—$SiR^{72}_3$)$_3$.

In each of the formulae (C1) and (C2), at least one $R^{72}$ is present.

In the formulae, $R^b$s are each individually a hydrolyzable group.

$R^b$ is preferably —OR, —OCOR, —O—N=C(R)$_2$, —N(R)$_2$, —NHR, or a halogen (wherein R is a substituted or unsubstituted C1-C4 alkyl group), preferably —OR. Examples of R include unsubstituted alkyl groups such as methyl, ethyl, propyl, isopropyl, n-butyl, and isobutyl groups; and substituted alkyl groups such as a chloromethyl group. Preferred among these are alkyl groups, particularly unsubstituted alkyl groups, and more preferred is a methyl group or an ethyl group. $R^b$ is more preferably —OR (wherein R is a substituted or unsubstituted $C_{1-3}$ alkyl group, more preferably a methyl group).

In the formulae, $R^c$s are each individually a hydrogen atom or a lower alkyl group. The lower alkyl group is preferably a C1-C20 alkyl group, more preferably a C1-C6 alkyl group, still more preferably a methyl group.

In the formulae, k1s are each individually an integer of 1 to 3; l1s are each individually an integer of 0 to 2; and m1s are each individually an integer of 0 to 2. The sum of k1, l1, and m1 is 3.

The compounds represented by any of the formulae (C1) and (C2) can be obtained by preparing a perfluoropolyether derivative which corresponds to the Rf-PFPE-moiety as a starting material, introducing a hydroxy group to an end, then introducing a group containing an unsaturated bond to an end, allowing this group containing an unsaturated bond and a silyl derivative containing a halogen atom to react with each other, introducing a hydroxy group to an end of the silyl group, and then allowing the introduced group containing an unsaturated bond and the silyl derivative with each other. For example, the compounds may be obtained as follows.

Preferred as the compounds represented by any of the formulae (C1) and (C2) are compounds respectively represented by the following formulae (C1″) and (C2″):

[Chem. 23]

$$\text{Rf-PFPE-X}^7\text{—SiR}^a{}_3 \quad (C1'')$$

$$R^a{}_3\text{Si—X}^{7'}\text{—PFPE-X}^{7'}\text{SiR}^a{}_3 \quad (C2'')$$

wherein

PFPEs are each individually a group represented by the formula:

$$-(OC_4F_8)_a-(OC_3F_6)_b-(OC_2F_4)_c-(OCF_2)_d-$$

(wherein a, b, c, and d are each individually an integer of 0 to 200, the sum of a, b, c, and d is at least 1, and the parenthesized repeating units with the respective subscripts a, b, c, and d may be present in any order in the formula);

Rfs are each individually a C1-C16 alkyl group optionally substituted by one or more fluorine atoms;

$X^7$ is $-CH_2O(CH_2)_2-$, $-CH_2O(CH_2)_3-$, or $-CH_2O(CH_2)_6-$;

$R^a$s are each individually $-Z^1-SiR^{71}{}_{p1}R^{72}{}_{q1}R^{73}{}_{r1}$;

$Z^1$ is a $C_{1-6}$ alkylene group;

$R^{71}$s are each individually $R^{a'}$;

$R^{a'}$ is defined in the same manner as $R^a$;

in $R^a$, the number of Si linearly linked via the $Z^1$ group is at most five;

$R^{72}$s are each individually a hydrolyzable group;

$R^{73}$s are each individually a hydrogen atom or a lower alkyl group;

p1s are each individually an integer of 0 to 2;

q1s are each individually an integer of 1 to 3, preferably 3;

r1s are each individually an integer of 0 to 2; and in one $R^a$, the sum of p1, q1, and r1 is 3.

For example, the compounds represented by any of the formulae (C1) and (C2) can be produced as follows. Specifically, a compound represented by the following formula (C1-4) or (C2-4):

[Chem. 24]

$$(\text{Rf-PFPE})_{\gamma}\text{-X}^7\text{—}(R^{92}\text{—CH}=\text{CH}_2)_{\gamma} \quad (C1\text{-}4)$$

$$(\text{CH}_2=\text{CH—R}^{92})_{\gamma'}\text{—X}^{7'}\text{—PFPE-X}^7\text{—}(R^{92}\text{—CH}=\text{CH}_2)_{\gamma} \quad (C2\text{-}4)$$

(wherein

PFPEs are each individually a group represented by the formula:

$$-(OC_4F_8)_a-(OC_3F_6)_b-(OC_2F_4)_c-(OCF_2)_d-$$

(wherein a, b, c, and d are each individually an integer of 0 to 200, the sum of a, b, c, and d is at least 1, and the parenthesized repeating units with the respective subscripts a, b, c, and d may be present in any order in the formula);

Rfs are each individually a C1-C16 alkyl group optionally substituted by one or more fluorine atoms;

$X^7$s are each individually a single bond or a divalent to decavalent organic group;

γs are each individually an integer of 1 to 9;

γ's are each individually an integer of 1 to 9; and $R^{92}$ is a single bond or a divalent organic group) is reacted with a compound represented by $HSiR^{93}{}_{k1}R^b{}_{l1}R^c{}_{m1}$ (wherein $R^{93}$ is a halogen atom, such as a fluorine atom, a chlorine atom, a bromine atom, or an iodine atom, preferably a chlorine atom; $R^b$s are each individually a hydrolyzable group; $R^c$s are each individually a hydrogen atom or a lower alkyl group; k1 is an integer of 1 to 3; l1 and m1 are each individually an integer of 0 to 2; and the sum of k1, l1, and m1 is 3), so that a compound represented by the formula (C1-5) or (C2-5):

[Chem. 25]

$$(\text{Rf-PFPE})_{\gamma}\text{—X}^7\text{—}(R^{92}\text{—CH}_2\text{CH}_2\text{—SiR}^{93}{}_{k1}R^b{}_{l1}R^c{}_{m1})_{\gamma} \quad (C1\text{-}5)$$

$$(R^c{}_{m1}R^b{}_{l1}R^{93}{}_{k1}\text{Si—CH}_2\text{CH}_2\text{—}R^{92})_{\gamma'}\text{—X}^{7'}\text{—PFPE-}^{**}\text{X}^7\text{—}(R^{92}\text{—CH}_2\text{CH}_2\text{—SiR}^{93}{}_{k1}R^b{}_{l1}R^c{}_{m1})_{\gamma} \quad (C2\text{-}5)$$

(wherein Rf, PFPE, $R^{92}$, $R^{93}$, $R^b$, $R^c$, γ, γ', $X^7$, k1, l1, and m1 are defined in the same manner as mentioned above) is obtained.

Reacting the resulting compound represented by the formula (C1-5) or (C2-5) with a compound represented by Hal-J-$R^{94}$—CH=CH$_2$ (wherein Hal is a halogen atom (e.g., I, Br, Cl, F); J is Mg, Cu, Pd, or Zn; and $R^{94}$ is a single bond or a divalent organic group) provides a compound represented by the formula (C1-6) or (C2-6):

[Chem. 26]

$$(\text{Rf-PFPE})_{\gamma}\text{—X}^7\text{—}(R^{92}\text{—CH}_2\text{CH}_2\text{—SiR}^b{}_{l1}R^c{}_{m1}(R^{94}\text{—CH}=\text{CH}_2)_{k1})_{\gamma} \quad (C1\text{-}6)$$

$$((\text{CH}=\text{CH}_2\text{—}R^{94})_{k1}R^c{}_{m1}R^b{}_{l1}\text{Si—CH}_2\text{CH}_2\text{—}R^{92})_{\gamma'}\text{—X}^{7'}\text{-PFPE-}^{**}\text{X}^7\text{—}(R^{92}\text{—CH}_2\text{CH}_2\text{—SiR}^b{}_{l1}R^c{}_{m1}(R^{94}\text{—CH}=\text{CH}_2)_{k1})_{\gamma} \quad (C2\text{-}6)$$

(wherein Rf, PFPE, $R^{92}$, $R^{94}$, $R^b$, $R^c$, γ, γ', $X^7$, k1, l1, and m1 are defined in the same manner as mentioned above).

Reacting the resulting compound represented by the formula (C1-6) or (C2-6) with HSiM$_3$ (wherein Ms are each individually a halogen atom, $R^{72}$, or $R^{73}$; $R^{72}$s are each individually a hydrolyzable group; and $R^{73}$s are each individually a hydrogen atom or a lower alkyl group) and if necessary converting the optional halogen atom(s) into $R^{72}$ or $R^{73}$ can provide a compound represented by the formula (C1‴) or (C2‴):

[Chem. 27]

$$(\text{Rf-PFPE})_{\gamma}\text{—X}^7\text{—}(R^{92}\text{—CH}_2\text{CH}_2\text{—SiR}^b{}_{l1}R^c{}_{m1}(R^{94}\text{—CH}_2\text{CH}_2\text{—SiR}^{72}{}_{q1}R^{73}{}_{r1})_{k1})_{\gamma} \quad (C1''')$$

$$((R^{72}{}_{q1}R^{73}{}_{r1}\text{Si—CH}_2\text{CH}_2\text{—}R^{94})_{k1}R^c{}_{m1}R^b{}_{l1}\text{Si—CH}_2\text{CH}_2\text{—}R^{92})_{\gamma'}\text{—X}^7\text{—PFPE-}^{**}\text{X}^7\text{—}(R^{92}\text{—CH}_2\text{CH}_2\text{—SiR}^b{}_{l1}R^c{}_{m1}(R^{94}\text{—CH}_2\text{CH}_2\text{—SiR}^{72}{}_{q1}R^{73}{}_{r1})_{k1})_{\gamma} \quad (C2''')$$

wherein

Rf, PFPE, $R^{72}$, $R^{73}$, $R^{92}$, $R^{94}$, $R^b$, $R^c$, γ, γ', $X^7$, k1, l1, and m1 are defined in the same manner as mentioned above;

q1s are each individually an integer of 1 to 3; and r1s are each individually an integer of 0 to 2.

In the formula (C1''') or (C2'''), the portion from $X^{7'}$ to $R^{92}$—CH$_2$CH$_2$— corresponds to $X^7$ in the formula (C1) or (C2), and —$R^{94}$—CH$_2$CH$_2$— corresponds to Z in the formula (C1) or (C2).

The formulae (D1) and (D2) are as follows.

[Chem. 28]

$$(Rf\text{-}PFPE)_\delta\text{—}X^9\text{—}(CR^d_{k2}R^e_{l2}R^f_{m2})_{\delta'} \quad (D1)$$

$$(R^f_{m2}R^e_{l2}R^d_{k2}C)_{\delta'}\text{—}X^9\text{—}PFPE\text{-}X\text{—}(CR^d_{k2}R^e_{l2}R^f_{m2})_\delta \quad (D2)$$

In the formulae (D1) and (D2), Rf and PFPE are defined in the same manner as in the formulae (A1) and (A2).

In the formulae, $X^9$s are each individually a single bond or a divalent to decavalent organic group. This $X^9$ is understood as a linker that couples a perfluoropolyether moiety (i.e., Rf-PFPE moiety or -PFPE-moiety) mainly providing properties such as water repellency and surface smoothness and a moiety providing the adhesiveness to a substrate (i.e., the parenthesized group with the subscript δ) in the compounds represented by the formulae (D1) and (D2). Thus, the $X^9$ may be any organic group that allows the compounds represented by the formulae (D1) and (D2) to be present stably.

In the formulae, δ is an integer of 1 to 9 and δ' is an integer of 1 to 9. These δ and δ' may vary in accordance with the valence of $X^9$. In the formula (D1), the sum of δ and δ' is the same as the valence of $X^9$. For example, when $X^9$ is a decavalent organic group, the sum of δ and δ' is 10, where δ is 9 and δ' is 1, δ is δ and δ' is 5, or δ is 1 and 5' is 9, for example. When $X^9$ is a divalent organic group, δ and δ' are both 1. In the formula (D2), δ is a value obtained by subtracting 1 from the valence of $X^9$.

$X^9$ is preferably a divalent to heptavalent, more preferably divalent to tetravalent, still more preferably divalent organic group.

In an embodiment, $X^9$ is a divalent to tetravalent organic group, δ is 1 to 3, and δ' is 1.

In another embodiment, $X^9$ is a divalent organic group, δ is 1, and δ' is 1. In this embodiment, the formulae (D1) and (D2) are represented by the following formulae (D1') and (D2').

[Chem. 29]

$$Rf\text{-}PFPE\text{-}X^9\text{—}CR^d_{k2}R^e_{l2}R^f_{m2} \quad (D1')$$

$$R^f_{m2}R^e_{l2}R^d_{k2}C\text{—}X^9\text{—}PFPE\text{-}X^9\text{—}CR^d_{k2}R^e_{l2}R^f_{m2} \quad (D2')$$

Examples of $X^9$ are, but not limited to, the same as those mentioned for $X^1$.

Preferred specific examples of $X^9$ among these include:
—CH$_2$O(CH$_2$)$_2$—,
—CH$_2$O(CH$_2$)$_3$—,
—CH$_2$O(CH$_2$)$_6$—,
—CH$_2$O(CH$_2$)$_3$Si(CH$_3$)$_2$OSi(CH$_3$)$_2$(CH$_2$)$_2$—,
—CH$_2$O(CH$_2$)$_3$Si(CH$_3$)$_2$OSi(CH$_3$)$_2$OSi(CH$_3$)$_2$(CH$_2$)$_2$—,
—CH$_2$O(CH$_2$)$_3$Si(CH$_3$)$_2$O(Si(CH$_3$)$_2$O)$_2$Si(CH$_3$)$_2$(CH$_2$)$_2$—,
—CH$_2$O(CH$_2$)$_3$Si(CH$_3$)$_2$O(Si(CH$_3$)$_2$O)$_3$Si(CH$_3$)$_2$(CH$_2$)$_2$—,
—CH$_2$O(CH$_2$)$_3$Si(CH$_3$)$_2$O(Si(CH$_3$)$_2$O)$_{10}$Si(CH$_3$)$_2$(CH$_2$)$_2$—,
—CH$_2$O(CH$_2$)$_3$Si(CH$_3$)$_2$O(Si(CH$_3$)$_2$O)$_{20}$Si(CH$_3$)$_2$(CH$_2$)$_2$—,
—CH$_2$OCF$_2$CHFOCF$_2$—,
—CH$_2$OCF$_2$CHFOCF$_2$CF$_2$—,
—CH$_2$OCF$_2$CHFOCF$_2$CF$_2$CF$_2$—,
—CH$_2$OCH$_2$CF$_2$CF$_2$OCF$_2$—,
—CH$_2$OCH$_2$CF$_2$CF$_2$OCF$_2$CF$_2$—,
—CH$_2$OCH$_2$CF$_2$CF$_2$OCF$_2$CF$_2$CF$_2$—,
—CH$_2$OCH$_2$CF$_2$CF$_2$OCF(CF$_3$)CF$_2$OCF$_2$—,
—CH$_2$OCH$_2$CF$_2$CF$_2$OCF(CF$_3$)CF$_2$OCF$_2$CF$_2$—,
—CH$_2$OCH$_2$CF$_2$CF$_2$OCF(CF$_3$)CF$_2$OCF$_2$CF$_2$CF$_2$—,
—CH$_2$OCH$_2$CHFCF$_2$OCF$_2$—,
—CH$_2$OCH$_2$CHFCF$_2$OCF$_2$CF$_2$—,
—CH$_2$OCH$_2$CHFCF$_2$OCF$_2$CF$_2$CF$_2$—,
—CH$_2$OCH$_2$CHFCF$_2$OCF(CF$_3$)CF$_2$OCF$_2$—,
—CH$_2$OCH$_2$CHFCF$_2$OCF(CF$_3$)CF$_2$OCF$_2$CF$_2$—,
—CH$_2$OCH$_2$CHFCF$_2$OCF(CF$_3$)CF$_2$OCF$_2$CF$_2$CF$_2$—,
—CH$_2$OCH$_2$(CH$_2$)$_7$CH$_2$Si(OCH$_3$)$_2$OSi(OCH$_3$)$_2$(CH$_2$)$_2$Si(OCH$_3$)$_2$OSi(OCH$_3$)$_2$(CH$_2$)$_2$—,
—CH$_2$OCH$_2$CH$_2$CH$_2$Si(OCH$_3$)$_2$OSi(OCH$_3$)$_2$(CH$_2$)$_3$—,
—CH$_2$OCH$_2$CH$_2$CH$_2$Si(OCH$_2$CH$_3$)$_2$OSi(OCH$_2$CH$_3$)$_2$(CH$_2$)$_3$—,
—CH$_2$OCH$_2$CH$_2$CH$_2$Si(OCH$_3$)$_2$OSi(OCH$_3$)$_2$(CH$_2$)$_2$—,
—CH$_2$OCH$_2$CH$_2$CH$_2$Si(OCH$_2$CH$_3$)$_2$OSi(OCH$_2$CH$_3$)$_2$(CH$_2$)$_2$—,
—(CH$_2$)$_2$—,
—(CH$_2$)$_3$—,
—(CH$_2$)$_4$—,
—(CH$_2$)$_5$—,
—(CH$_2$)$_6$—,
—(CH$_2$)$_2$—Si(CH$_3$)$_2$—(CH$_2$)$_2$—,
—CONH—(CH$_2$)$_3$—,
—CON(CH$_3$)—(CH$_2$)$_3$—,
—CON(Ph)-(CH$_2$)$_3$— (wherein Ph is phenyl),
—CONH—(CH$_2$)$_6$—,
—CON(CH$_3$)—(CH$_2$)$_6$—,
—CON(Ph)-(CH$_2$)$_6$— (wherein Ph is phenyl),
—CONH—(CH$_2$)$_2$NH(CH$_2$)$_3$—,
—CONH—(CH$_2$)$_6$NH(CH$_2$)$_3$—,
—CH$_2$O—CONH—(CH$_2$)$_3$—,
—CH$_2$O—CONH—(CH$_2$)$_6$—,
—S—(CH$_2$)$_3$—,
—(CH$_2$)$_2$S(CH$_2$)$_3$—,
—CONH—(CH$_2$)$_3$Si(CH$_3$)$_2$OSi(CH$_3$)$_2$(CH$_2$)$_2$—,
—CONH—(CH$_2$)$_3$Si(CH$_3$)$_2$OSi(CH$_3$)$_2$OSi(CH$_3$)$_2$(CH$_2$)$_2$—,
—CONH—(CH$_2$)$_3$Si(C$_3$)$_2$O(Si(CH$_3$)$_2$O)$_2$Si(CH$_3$)$_2$(CH$_2$)$_2$—,
—CONH—(CH$_2$)$_3$Si(C$_3$)$_2$O(Si(CH$_3$)$_2$O)$_3$Si(CH$_3$)$_2$(CH$_2$)$_2$—,
—CONH—(CH$_2$)$_3$Si(CH$_3$)$_2$O(Si(CH$_3$)$_2$O)$_{10}$Si(CH$_3$)$_2$(CH$_2$)$_2$—,
—CONH—(CH$_2$)$_3$Si(C$_3$)$_2$O(Si(CH$_3$)$_2$O)$_{20}$Si(CH$_3$)$_2$(CH$_2$)$_2$—,
—C(O)O—(CH$_2$)$_3$—,
—C(O)O—(CH$_2$)$_6$—,
—CH$_2$—O—(CH$_2$)$_3$—Si(CH$_3$)$_2$—(CH$_2$)$_2$—Si(CH$_3$)$_2$—(CH$_2$)$_2$—,
—CH$_2$—O—(CH$_2$)$_3$—Si(CH$_3$)$_2$—(CH$_2$)$_2$—Si(CH$_3$)$_2$—CH(CH$_3$)—,
—CH$_2$—O—(CH$_2$)$_3$—Si(C$_3$)$_2$—(CH$_3$)$_2$—(CH$_3$)$_2$—(CH$_2$)$_3$—,
—CH$_2$—O—(CH$_2$)$_3$—Si(CH$_3$)$_2$—(CH$_2$)$_2$—Si(CH$_3$)$_2$—CH(CH$_3$)—CH$_2$—,
—OCH$_2$—,
—O(CH$_2$)$_3$—,
—OCFHCF$_2$—, and
groups represented by the following formulae.

[Chem. 30]

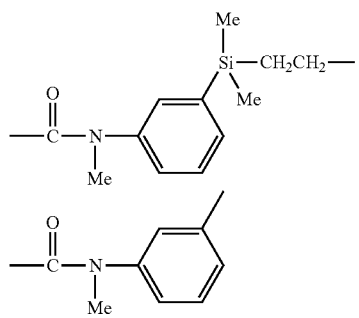

In the formulae, $R^d$s are each individually —$Z^2$—$CR^{81}_{p2}R^{82}_{q2}R^{83}_{r2}$.

In the formula, $Z^2$s are each individually an oxygen atom or a divalent organic group.

$Z^2$ is preferably a $C_{1-6}$ alkylene group, —$(CH_2)_g$—O—$(CH_2)_h$— (wherein g is an integer of 0 to 6, such as an integer of 1 to 6; and h is an integer of 0 to 6, such as an integer of 1 to 6), or -phenylene-$(CH_2)_i$— (wherein i is an integer of 0 to 6), more preferably a $C_{1-3}$ alkylene group. These groups may be substituted by one or more substituents selected from a fluorine atom, a $C_{1-6}$ alkyl group, a $C_{2-6}$ alkenyl group, and a $C_{2-6}$ alkynyl group.

In the formula, $R^{81}$s are each individually $R^{d'}$. $R^{d'}$ is defined in the same manner as $R^d$.

The number of C linearly linked via the $Z^2$ group in $R^d$ is at most five. In other words, when at least one $R^{81}$ is present in $R^d$, there are two or more Si atoms linearly linked via the $Z^2$ group in $R^d$, and the number of C atoms linearly linked via such a $Z^2$ group is at most five. The "number of C atoms linearly linked via the $Z^2$ group in $R^d$" is equivalent to the number of repeated —$Z^2$—C— units linearly linked in $R^d$. This is the same as the description regarding $R^a$ in the formulae (C1) and (C2)

In a preferred embodiment, the "number of C atoms linearly linked via the $Z^2$ group in $R^d$" is one (left formula) or two (right formula) in all the chains.

In an embodiment, the number of C atoms linearly linked via the $Z^2$ group in $R^d$ is one or two, preferably one.

In the formula, $R^{82}$ is —Y—$SiR^{85}_{n2}R^{86}_{3-n2}$.

Ys are each individually a divalent organic group.

In a preferred embodiment, Y is a $C_{1-6}$ alkylene group, —$(CH_2)_{g'}$—O—$(CH_2)_{h'}$— (wherein g' is an integer of 0 to 6, such as an integer of 1 to 6; and h' is an integer of 0 to 6, such as an integer of 1 to 6), or -phenylene-$(CH_2)_{i'}$— (wherein i' is an integer of 0 to 6). These groups may be substituted by one or more substituents selected from a fluorine atom, a $C_{1-6}$ alkyl group, a $C_{2-6}$ alkenyl group, and a $C_{2-6}$ alkynyl group.

In an embodiment, Y may be a $C_{1-6}$ alkylene group, —O—$(CH_2)_{h'}$—, or -phenylene-$(CH_2)_{i'}$—. When Y is any of the above groups, the light resistance, especially the ultraviolet resistance may be further improved.

$R^{85}$s are each individually a hydrolyzable group.

The "hydrolyzable group" as used herein means a group that may undergo hydrolysis. Examples of the hydrolyzable group include —OR, —OCOR, —O—N═C(R)$_2$, —N(R)$_2$, —NHR, and halogens (wherein R is a substituted or unsubstituted C1-C4 alkyl group). Preferred is —OR (alkoxy group). Examples of the group for R include unsubstituted alkyl groups such as methyl, ethyl, propyl, isopropyl, n-butyl, and isobutyl groups; and substituted alkyl groups such as a chloromethyl group. Preferred among these are alkyl groups, particularly unsubstituted alkyl groups, and more preferred is a methyl group or an ethyl group.

$R^{85}$ is preferably —OR, wherein R is a substituted or unsubstituted $C_{1-3}$ alkyl group, more preferably an ethyl group or a methyl group, particularly a methyl group.

$R^{86}$s are each individually a hydrogen atom or a lower alkyl group. The lower alkyl group is preferably a C1-C20 alkyl group, more preferably a C1-C6 alkyl group, still more preferably a methyl group.

In the formula, n2 is an integer of 1 to 3, preferably 2 or 3, more preferably 3, individually in each (—Y—$SiR^{85}_{n2}R^{86}_{3-n2}$) unit.

$R^{83}$s are each individually a hydrogen atom or a lower alkyl group. The lower alkyl group is preferably a C1-C20 alkyl group, more preferably a C1-C6 alkyl group, still more preferably a methyl group.

In the formula, p2s are each individually an integer of 0 to 3; q2s are each individually an integer of 0 to 3; and r2s are each individually an integer of 0 to 3. The sum of p2, q2, and r2 is 3.

In a preferred embodiment, in the terminal $R^{d'}$ (or $R^d$ if $R^{d'}$ is absent) in $R^d$, q2 is preferably 2 or greater, such as 2 or 3, more preferably 3.

In a preferred embodiment, at least one terminal of $R^d$ may be —C(—Y—$SiR^{85}_{q2}R^{86}_{r2}$)$_2$ or —C(—Y—$SiR^{85}_{q2}R^{86}_{r2}$)$_3$, and may preferably be —C(—Y—$SiR^{85}_{q2}R^{86}_{r2}$)$_3$. In the formula, the (—Y—$SiR^{85}_{q2}R^{86}_{r2}$) unit is preferably (—Y—$SiR^{85}_3$). In a more preferred embodiment, all the terminals of $R^d$ may be —C(—Y—$SiR^{85}_{q2}R^{86}_{r2}$)$_3$, preferably —C(—Y—$SiR^{85}_3$)$_3$.

In the formulae, $R^e$s are each individually —Y—$SiR^{85}_{n2}R^{86}_{3-n2}$. In the formula, Y, $R^{85}$, $R^{86}$, and n2 are defined in the same manner as in $R^{82}$.

In the formulae, $R^f$s are each individually a hydrogen atom or a lower alkyl group. The lower alkyl group is preferably a C1-C20 alkyl group, more preferably a C1-C6 alkyl group, still more preferably a methyl group.

In the formulae, k2s are each individually an integer of 0 to 3; l2s are each individually an integer of 0 to 3; and m2s are each individually an integer of 0 to 3. The sum of k2, l2, and m2 is 3.

In an embodiment, at least one k2 is 2 or 3, preferably 3.

In an embodiment, k2 is 2 or 3, preferably 3.

In an embodiment, l2 is 2 or 3, preferably 3.

In each of the formulae (D1) and (D2), at least one q2 is 2 or 3, or at least one l2 is 2 or 3. In other words, at least two —Y—$SiR^{85}_{n2}R^{89}_{3-n2}$ groups are present in each of the formulae.

The perfluoro(poly)ether group-containing silane compound represented by the formula (D1) or the formula (D2) can be produced by combination of known methods. For example, although the method is not limited thereto, the compound represented by the formula (D1') wherein X is divalent can be produced as follows.

A double bond-containing group (preferably allyl) and a halogen (preferably bromo) are introduced into a polyhydric alcohol represented by HO—X—C(YOH)$_3$ (wherein X and Y are each individually a divalent organic group) to provide a double bond-containing halide represented by Hal-X—C(Y—O—R—CH═CH$_2$)$_3$ (wherein Hal is a halogen such as Br; and R is a divalent organic group such as an alkylene group). Next, the terminal halogen is reacted with a perfluoropolyether group-containing alcohol represented by $R^{PFPE}$—OH (wherein $R^{PFPE}$ is a perfluoropolyether group-containing group) to provide $R^{PFPE}$—O—X—C(Y—O—R—CH═CH$_2$)$_3$. Next, the terminal —CH═CH$_2$ is reacted with HSiCl$_3$ and an alcohol or HSiR$^{85}_3$ to provide R$^{PFPE}$—O—X—C(Y—O—R—CH$_2$—CH$_2$—SiR$^{85}_3$)$_3$.

The perfluoro(poly)ether group-containing silane compound represented by any of the above formulae (A1), (A2), (B1), (B2), (C1), (C2), (D1), and (D2) may have a number average molecular weight of 5×10$^2$ to 1×10$^5$, although it is not limited thereto. The number average molecular weight may preferably be 2,000 to 30,000, more preferably 3,000 to 10,000, still more preferably 3,000 to 8,000.

In the invention, the "number average molecular weight" is determined by gel permeation chromatography (GPC).

The number average molecular weight of the PFPE moiety in the perfluoro(poly)ether group-containing silane compound may preferably be, but is not limited to, 1,500 to 30,000, more preferably 2,500 to 10,000, still more preferably 3,000 to 8,000.

The release layer may be produced by, for example, a method of immersing the mold into a composition that contains a compound containing a hydrolyzable group or a silane compound containing the perfluoro(poly)ether group and a solvent; a method of exposing the mold to the vapor of the composition, thereby vapor-depositing the composition on the mold; a method of printing the composition on the mold; or a method of inkjet-applying the composition to the mold. The immersion, deposition, printing, or application may be followed by drying.

In the step (1), a composition containing the fluoropolyether is applied to the release layer. This application may be achieved by, for example, a method of immersing the mold provided with the release layer into a composition containing the fluoropolyether; a method of spraying a composition containing the fluoropolyether to the release layer; or a method of vapor-depositing a composition containing the fluoropolyether on the release layer.

The fluoropolyether easily adheres to the transfer target during transfer. Thus, when the transfer is repeated, the fluoropolyether is preferably added so as to supplement the portion of the fluoropolyether adhering to the transfer target and thus being consumed. When the mold is a roll-like mold, only part of the mold is in contact with the transfer target. Thus, the fluoropolyether can be smoothly supplemented by continuously or intermittently applying the fluoropolyether to the region in no contact with the transfer target.

The fluoropolyether is preferably free from the aforementioned hydrolyzable group. The fluoropolyether without the hydrolyzable group does not chemically bond to the mold and the release layer, but adheres to the release layer or permeates into the release layer. Thus, the fluoropolyether can protect the release layer without impairing the releasability of the release layer or deforming the uneven pattern. Further, in transfer of a fine uneven pattern, the perfluoropolyether compound is transferred to the surface of the transfer target, imparting the water repellency, oil repellency, and anti-fouling performance.

The fluoropolyether is more preferably a compound represented by the formula:

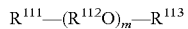

(wherein R$^{111}$ and R$^{113}$ are each individually F, a C1-C16 alkyl group, a C1-C16 alkoxy group, a C1-C16 fluorinated alkyl group, a C1-C16 fluorinated alkoxy group, or —R$^{14}$—X$^{111}$ (wherein R$^{114}$ is a single bond or a divalent organic group; and X$^{111}$ is —NH$_2$, —OH, —COOH, —CH=CH$_2$, —OCH$_2$CH=CH$_2$, a halogen, phosphoric acid, a phosphoric acid ester, a carboxylic acid ester, thiol, thioether, an alkyl ether (optionally substituted by fluorine, an aryl, an aryl ether, or an amide); R$^{112}$ is a C1-C4 fluorinated alkylene group; and m is an integer of 2 or greater). In order to impart the water repellency, oil repellency, and anti-fouling performance, X$^{111}$ is preferably at least one selected from the group consisting of —OH, —COOH, thiol (—SH), —CH=CH$_2$, and —OCH$_2$CH=CH$_2$. Examples of the divalent organic group include alkylene groups, fluorinated alkylene groups, and such groups containing an oxygen atom bonded to an end of the group. The divalent organic group may contain any number of carbon atoms, such as 1 to 16 carbon atoms.

R$^{111}$ and R$^{113}$ are preferably each individually F, a C1-C3 alkyl group, a C1-C3 fluorinated alkyl group, or —R$^{114}$—X$^{111}$ (wherein R$^{114}$ and X$^{111}$ are defined in the same manner as mentioned above), more preferably F, a C1-C3 perfluorinated alkyl group, or —R$^{114}$—X$^{111}$ (wherein R$^{114}$ and X$^{111}$ are defined in the same manner as mentioned above).

In the formula, m is preferably an integer of 300 or smaller, more preferably an integer of 100 or smaller.

R$^{112}$ is preferably a C1-C4 perfluorinated alkylene group. Examples of —R$^{112}$O— include:

those represented by the formula:

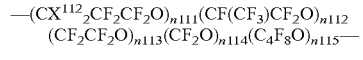

wherein n111, n112, n113, n114, and n115 are each individually 0 or an integer of 1 or greater; X$^{112}$ is H, F, or Cl; and the repeating units may be present in any order; and those represented by the formula:

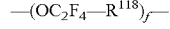

wherein R$^{118}$ is a group selected from OC$_2$F$_4$, OC$_3$F$_6$, and OC$_4$F$_8$; and f is an integer of 2 to 100.

In the formula, n111 to n115 are each preferably an integer of 0 to 200. The sum of n111 to n115 is preferably 1 or greater, more preferably 5 to 300, still more preferably 10 to 200, particularly preferably 10 to 100.

R$^{118}$ is a group selected from OC$_2$F$_4$, OC$_3$F$_6$, and OC$_4$F$_8$, or combination of two or three groups individually selected from these groups. Examples of the combination of two or three groups individually selected from OC$_2$F$_4$, OC$_3$F$_6$, and OC$_4$F$_8$ include, but are not limited to, —OC$_2$F$_4$OC$_3$F$_6$—, —OC$_2$F$_4$OC$_4$F$_8$—, —OC$_3$F$_6$OC$_2$F$_4$—, —OC$_3$F$_6$OC$_3$F$_6$—, —OC$_3$F$_6$OC$_4$F$_8$—, —OC$_4$F$_8$OC$_4$F$_8$—, —OC$_4$F$_8$OC$_3$F$_6$—, —OC$_4$F$_8$OC$_2$F$_4$—, —OC$_2$F$_4$OC$_2$F$_4$OC$_3$F$_6$—, —OC$_2$F$_4$OC$_2$F$_4$OC$_4$F$_8$—, —OC$_2$F$_4$OC$_3$F$_6$OC$_2$F$_4$—, —OC$_2$F$_4$OC$_3$F$_6$OC$_3$F$_6$—, —OC$_2$F$_4$OC$_4$F$_8$OC$_2$F$_4$—, —OC$_3$F$_6$OC$_2$F$_4$OC$_2$F$_4$—, —OC$_3$F$_6$OC$_2$F$_4$OC$_3$F$_6$—, —OC$_3$F$_6$OC$_3$F$_6$OC$_2$F$_4$—, and —OC$_4$F$_8$OC$_2$F$_4$OC$_2$F$_4$—. In the formula, f is an integer of 2 to 100, preferably an integer of 2 to 50. In the formula, OC$_2$F$_4$, OC$_3$F$_6$, and OC$_4$F$_8$ each may be linear or branched, preferably linear. In this embodiment, the formula: —(OC$_2$F$_4$—R$^{118}$)$_f$— is preferably the formula: —(OC$_2$F$_4$—OC$_3$F$_6$)$_f$— or the formula: —(OC$_2$F$_4$—OC$_4$F$_8$)$_f$—.

The fluoropolyether preferably has a weight average molecular weight of 500 to 100000, more preferably 50000 or less, still more preferably 10000 or less, particularly preferably 6000 or less. The weight average molecular weight can be determined by gel permeation chromatography (GPC).

Examples of commercially available products of the fluoropolyether include Demnum (Daikin Industries, Ltd.), Fomblin (Solvay Specialty Polymers Japan K. K.), Barrierta (NOK Klüber Co., Ltd.), and Krytox (DuPont).

The composition may consist only of the fluoropolyether. Nevertheless, in order to allow the composition to have low surface free energy and to be easily applied, the composition preferably contains a solvent (other than the fluoropolyether), more preferably contains a fluorine-based solvent (other than the fluoropolyether). Examples of the fluorine-based solvent include perfluorohexane, perfluoromethylcyclohexane, perfluoro-1,3-dimethylcyclohexane, dichloropentafluoropropane, hydrofluoroether (HFE), hexafluoromethaxylene, and Zeorora H (Zeon Corp.), and HFE is preferred.

When the composition contains the solvent, the amount of the fluoropolyether is preferably 10 to 0.0001 mass % relative to the composition. The amount thereof is more preferably 1 to 0.001 mass %, still more preferably 0.1 to 0.001 mass %. The amount of the fluoropolyether is also preferably 0.01 mass % or more relative to the composition. The fluoropolyether in an amount within the above range makes the application easy.

The hydrofluoroether (HFE) is preferably a compound represented by $Rf^{21}$—O—$R^{21}$ (wherein $Rf^{21}$ is a C1-C10 fluorinated alkyl group; and $R^{21}$ is a C1-C3 non-fluorinated alkyl group), and examples thereof include $C_3F_7OCH_3$, $C_4F_9OCH_3$, $C_4F_9OC_2H_5$, and $C_2F_5CF(OCH_3)C_3F_7$.

In the step (2), the mold obtained in the step (1) is pressed to a transfer target so that the uneven pattern is transferred.

In the step (2), the transfer target may be heated or irradiated with light while the mold is pressed to the transfer target, so that the transfer target may be cured.

The production method may further include, after the step (3), heating the transfer target or irradiating the transfer target with light to cure the transfer target.

When the transfer target is irradiated with ultraviolet rays and thereby cured while the mold is pressed to the transfer target in the step (2), the transfer target may unfortunately separate from a substrate or adhere to the mold.

On the contrary, since the above production method includes the step (1), it can avoid separation or adhesion of the transfer target. Thus, it is also a preferred embodiment of the production method of the invention that in the step (2), the transfer target is irradiated with ultraviolet rays while the mold is pressed to the transfer target.

The transfer target may be disposed on a substrate. The material of the substrate may be silicon, synthetic resin, glass, metal, or ceramic, for example. Synthetic resin is preferred because it has flexibility and a roll-like mold can thus be pressed thereto.

Examples of the synthetic resin include cellulose resins such as triacetyl cellulose (TAC), polyolefins such as polyethylene, polypropylene, ethylene-propylene copolymers, and ethylene-vinyl acetate copolymers (EVA), cyclic polyolefins, modified polyolefins, polyvinyl chloride, polyvinylidene chloride, polystyrene, polyamide, polyimide, polyamide-imide, polycarbonate, poly-(4-methyl pentene-1), ionomers, acrylic resin, polymethyl methacrylate, acryl-styrene copolymers (AS resin), butadiene-styrene copolymers, ethylene-vinyl alcohol copolymers (EVOH), polyesters such as polyethylene terephthalate (PET), polybutylene terephthalate (PBT), and polycyclohexane terephthalate (PCT), polyether, polyether ketone (PEK), polyether ether ketone (PEEK), polyetherimide, polyacetal (POM), polyphenylene oxide, modified polyphenylene oxide, polyarylate, aromatic polyester (liquid crystal polymers), polytetrafluoroethylene, polyvinylidene fluoride, other fluororesins, styrene-, polyolefin-, polyvinyl chloride-, polyurethane-, fluororubber-, or chlorinated polyethylene-based thermoplastic elastomers, epoxy resin, phenol resin, urea resin, melamine resin, unsaturated polyester, silicone resin, and polyurethane, and copolymers, blends, and polymer alloys mainly formed from these polymers. One or two or more of these may be used in combination (for example, in the form of a laminate of two or more layers).

The transfer target preferably contains a curable resin or a curable monomer, more preferably contains the curable resin.

The curable resin may be either a photo-curable resin or a thermosetting resin, and may be any resin having heat resistance and strength. A photo-curable resin is preferred, and an ultraviolet-curable resin is more preferred.

Examples of the curable resin include acrylic polymers, polycarbonate polymers, polyester polymers, polyamide polymers, polyimide polymers, polyethersulfone polymers, cyclic polyolefin polymers, fluorine-containing polyolefin polymers (e.g., PTFE), and fluorine-containing cyclic amorphous polymers (e.g., Cytop®, Teflon® AF). If the step (2) is followed by an operation such as ultraviolet curing, a transparent resin is preferred.

Specific examples of the curable resin or monomers constituting the curable resin include alkyl vinyl ethers such as cyclohexyl methyl vinyl ether, isobutyl vinyl ether, cyclohexyl vinyl ether, and ethyl vinyl ether, glycidyl vinyl ether, vinyl acetate, vinyl pivalate, (meth)acrylates such as phenoxyethyl acrylate, benzyl acrylate, stearyl acrylate, lauryl acrylate, 2-ethylhexyl acrylate, allyl acrylate, 1,3-butanediol diacrylate, 1,4-butanediol diacrylate, 1,6-hexanediol diacrylate, trimethylol, propane triacrylate, pentaerythritol triacrylate, dipentaerythritol hexaacrylate, ethoxyethyl acrylate, methoxyethyl acrylate, glycidyl acrylate, tetrahydrofurfuryl acrylate, diethylene glycol diacrylate, neopentyl glycol diacrylate, polyoxyethylene glycol diacrylate, tripropylene glycol diacrylate, 2-hydroxyethyl acrylate, 2-hydroxypropyl acrylate, 4-hydroxybutyl vinyl ether, N,N-diethylaminoethyl acrylate, N,N-dimethylaminoethyl acrylate, N-vinylpyrrolidone, and dimethylaminoethyl methacrylate, silicone-based acrylates, maleic anhydride, vinylene carbonate, linear side chain polyacrylates, cyclic side chain polyacrylates, polynorbornene, polynorbornadiene, polycarbonate, polysulfonamide, and fluorine-containing cyclic amorphous polymers (e.g., Cytop®, Teflon® AF).

The curable monomer may be either a photo-curable monomer or a thermosetting monomer, and is preferably an ultraviolet-curable monomer.

Examples of the curable monomer include (a) urethane (meth)acrylates, (b) epoxy (meth)acrylates, (c) polyester (meth)acrylates, (d) polyether (meth)acrylates, (e) silicone (meth)acrylates, and (f) (meth)acrylate monomers.

Specific examples of the curable monomer include the following.

Examples of the urethane (meth)acrylates (a) include poly((meth)acryloyloxyalkyl)isocyanurates typified by tris (2-hydroxyethyl)isocyanurate diacrylate and tris(2-hydroxyethyl)isocyanurate triacrylate.

The epoxy (meth)acrylates (b) are obtained by adding a (meth)acryloyl group to an epoxy group, typified by those obtained from bisphenol A, bisphenol F, phenol novolac, or an alicyclic compound serving as a starting material.

For the polyester (meth)acrylates (c), the polyester moiety thereof may be constituted by any of polyhydric alcohols such as ethylene glycol, 1,4-butanediol, 1,6-hexanediol, diethylene glycol, trimethylolpropane, dipropylene glycol, polyethylene glycol, polypropylene glycol, pentaerythritol, and dipentaerythritol, and by any of polybasic acids such as phthalic acid, adipic acid, maleic acid, trimellitic acid, itaconic acid, succinic acid, terephthalic acid, and alkenylsuccinic acid.

Examples of the polyether (meth)acrylates (d) include polyethylene glycol di(meth)acrylate, polypropylene glycol di(meth)acrylate, and polyethylene glycol-polypropylene glycol di(meth)acrylate.

The silicone (meth)acrylates (e) are those obtained by modifying one or both of the ends of dimethyl polysiloxane having a molecular weight of 1,000 to 10,000 with a (meth)acryloyl group, and examples thereof include the following compounds.

[Chem. 31]

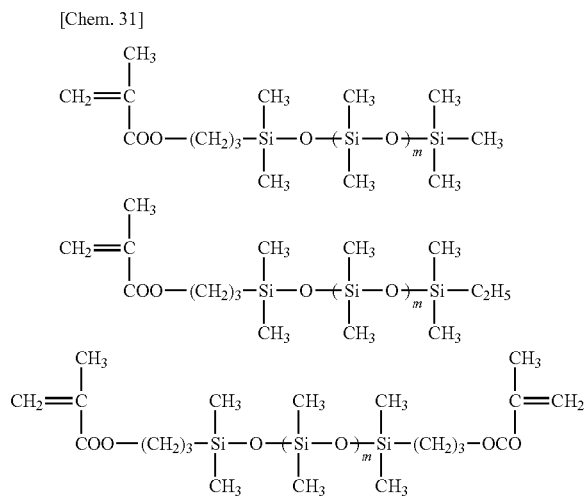

Examples of the (meth)acrylate monomers (f) include methyl (meth)acrylate, ethyl (meth)acrylate, n-propyl (meth)acrylate, isopropyl (meth)acrylate, n-butyl (meth)acrylate, isobutyl (meth)acrylate, sec-butyl (meth)acrylate, t-butyl (meth)acrylate, n-pentyl (meth)acrylate, 3-methylbutyl (meth)acrylate, n-hexyl (meth)acrylate, 2-ethyl-n-hexyl (meth)acrylate, n-octyl (meth)acrylate, cyclohexyl (meth)acrylate, isobornyl (meth)acrylate, benzyl (meth)acrylate, 2-hydroxyethyl (meth)acrylate, 2-hydroxypropyl (meth)acrylate, 3-hydroxypropyl (meth)acrylate, 4-hydroxybutyl (meth)acrylate, 5-hydroxypentyl (meth)acrylate, 6-hydroxyhexyl (meth)acrylate, 4-hydroxycyclohexyl (meth)acrylate, neopentyl glycol mono(meth)acrylate, 3-chloro-2-hydroxypropyl (meth)acrylate, (1,1-dimethyl-3-oxobutyl) (meth)acrylate, 2-acetoacetoxyethyl (meth)acrylate, 2-methoxyethyl (meth)acrylate, 2-ethoxyethyl (meth)acrylate, neopentyl glycol mono(meth)acrylate, 3-chloro-2-hydroxypropyl (meth)acrylate, glycerol mono(meth)acrylate, ethylene glycol diacrylate, propylene glycol diacrylate, 1,6-hexanediol diacrylate, 1,9-nonanediol diacrylate, 1,10-decanediol diacrylate, trimethylol propane triacrylate, and pentaerythritol tetraacrylate.

Preferred commercially available products of the curable resin and the curable monomer are as follows.

Examples of preferred commercially available products of the curable resin include: silicone resins such as PAK-01 and PAK-02 (Toyo Gosei Co., Ltd.); nanoimprint resins such as NIF series (Asahi Glass Co., Ltd.); nanoimprint resins such as OCNL series (Tokyo Ohka Kogyo Co., Ltd.) and NIAC 2310 (Daicel Chemical Industries, Co., Ltd.); epoxy acrylate resins such as EH-1001, ES-4004, EX-C101, EX-C106, EX-C300, EX-C501, EX-0202, EX-0205, and EX-5000 (Kyoeisha Chemical Co., Ltd.); and hexamethylene diisocyanate-based polyisocyanates such as Sumidur N-75, Sumidur N3200, Sumidur HT, Sumidur N3300, and Sumidur N3500 (Sumitomo Bayer Urethane Co., Ltd.).

Examples of preferred commercially available products of silicone acrylate resins among the curable monomers include: Silaplane FM-0611, Silaplane FM-0621, and Silaplane FM-0625; bi-terminal-type (meth)acrylate resins such as Silaplane FM-7711, Silaplane FM-7721, and Silaplane FM-7725; Silaplane FM-0411, Silaplane FM-0421, Silaplane FM-0428, Silaplane FM-DA11, Silaplane FM-DA21, and Silaplane DA25; mono-terminal-type (meth)acrylate resins such as Silaplane FM-0711, Silaplane FM-0721, Silaplane FM-0725, Silaplane TM-0701, and Silaplane TM-0701T (JCN Co., Ltd.).

Examples of preferred commercially available products of polyfunctional acrylates include A-9300, A-9300-1CL, A-GLY-9E, A-GLY-20E, A-TMM-3, A-TMM-3L, A-TMM-3LM-N, A-TMPT, and A-TMMT (Shin-Nakamura Chemical Co., Ltd.).

An example of preferred commercially available products of polyfunctional methacrylates is TMPT (Shin-Nakamura Chemical Co., Ltd.).

Examples of preferred commercially available products of alkoxysilane group-containing (meth)acrylates include 3-(meth)acryloyloxypropyltrichlorosilane, 3-(meth)acryloyloxypropyltrimethoxysilane, 3-(meth)acryloyloxypropyltriethoxysilane, 3-(meth)acryloyloxypropyltriisopropoxysilane, (also referred to as (triisopropoxysilyl)propyl methacrylate (abbreviation: TISMA) and (triisopropoxysilyl)propyl acrylate), 3-(meth)acryloxyisobutyltrichlorosilane, 3-(meth)acryloxyisobutyltriethoxysilane, 3-(meth)acryloxyisobutyltriisopropoxysilane, and 3-(meth)acryloxyisobutyltrimethoxysilane.

The transfer target may also preferably contain a crosslinking catalyst. Examples of the crosslinking catalyst include a radical polymerization initiator and an acid generator.

The radical polymerization initiator is a compound that generates a radical by heat or light, and examples thereof include a radical thermal polymerization initiator and a radical photo-polymerization initiator. In the invention, a radical photo-polymerization initiator is preferred.

Examples of the radical thermal polymerization initiator include: peroxide compounds, including diacyl peroxides such as benzoyl peroxide and lauroyl peroxide, dialkyl peroxides such as dicumyl peroxide and di-t-butyl peroxide, peroxy carbonates such as diisopropyl peroxydicarbonate and bis(4-t-butylcyclohexyl)peroxydicarbonate, and alkyl peresters such as t-butyl peroxyoctoate and t-butyl peroxybenzoate; and radical-generating azo compounds such as azobisisobutyronitrile.

Examples of the radical photo-polymerization initiator include: -diketones such as benzyl and diacetyl; acyloins such as benzoin; acyloin ethers such as benzoin methyl ether, benzoin ethyl ether, and benzoin isopropyl ether; thioxanthones such as thioxanthone, 2,4-diethyl thioxanthone, and thioxanthone-4-sulfonic acid; benzophenones such as benzophenone, 4,4'-bis(dimethylamino)benzophenone, and 4,4'-bis(diethylamino)benzophenone; acetophenones such as acetophenone, 2-(4-toluenesulfonyloxy)-2-phenylacetophenone, p-dimethylaminoacetophenone, 2,2'-dimethoxy-2-phenylacetophenone, p-methoxyacetophenone, 2-methyl[4-(methylthio)phenyl]-2-morpholino-1-propanone, and 2-benzyl-2-dimethylamino-1-(4-morpholinophenyl)-butan-1-one; quinones such as anthraquinone and 1,4-naphthoquinone; aminobenzoic acids such as ethyl 2-dimethylaminobenzoate, ethyl 4-dimethylaminobenzoate, (n-butoxy)ethyl 4-dimethylaminobenzoate, isoamyl 4-dimethylaminobenzoate, and 2-ethylhexyl 4-dimethylaminobenzoate; halogen compounds such as phenacyl chloride and trihalomethyl phenyl sulfone; acyl phosphine oxides; and peroxides such as di-t-butyl peroxide.

Examples of commercially available products of the radical photo-polymerization initiator include:

Irgacure 651: 2,2-dimethoxy-1,2-diphenylethan-1-one,

Irgacure 184: 1-hydroxy-cyclohexyl-phenyl-ketone,

Irgacure 2959: 1-[4-(2-hydroxyethoxy)-phenyl]-2-hydroxy-2-methyl-1-propan-1-one, Irgacure 127: 2-hydroxy-1-{4-[4-(2-hydroxy-2-methyl-propionyl)-benzyl]-phenyl}-2-methyl-propan-1-one, Irgacure 907: 2-methyl-1-(4-methylthiophenyl)-2-morpholinopropan-1-one, Irgacure 369: 2-benzyl-2-dimethylamino-1-(4-morpholinophenyl)-butanone-1, Irgacure 379: 2-(dimethylamino)-2-[(4-methylphenyl)methyl]-1-[4-(4-morpholinyl)phenyl]-1-butanone, Irgacure 819: bis(2,4,6-trimethylbenzoyl)-phenylphosphine oxide, Irgacure 784: bis(η5-2,4-cyclopentadien-1-yl)-bis(2,6-difluoro-3-(1H-pyrrol-1-yl)-phenyl)titanium, Irgacure OXE01: 1,2-octanedione, 1-[4-(phenylthio)-, 2-(O-benzoyloxime), Irgacure OXE02: ethanone, 1-[9-ethyl-6-(2-methylbenzoyl)-9H-carbazol-3-yl]-, 1-(O-acetyloxime), Irgacure 261, Irgacure 369, Irgacure 500, Darocur 1173: 2-hydroxy-2-methyl-1-phenyl-propan-1-one, Darocur TPO: 2,4,6-trimethylbenzoyl-diphenyl-phosphine oxide, Darocur 1116, Darocur 2959, Darocur 1664, Darocur 4043, Irgacure 754-oxy-phenylacetic acid: Mixture of oxy-phenylacetic acid 2-[2-oxo-phenylacetoxyethoxy]ethyl ester and 2-(2-hydroxyethoxy)ethyl ester, Irgacure 500: Mixture of Irgacure 184 and benzophenone (1:1), Irgacure 1300: Mixture of Irgacure 369 and Irgacure 651 (3:7), Irgacure 1800: Mixture of CGI403 and Irgacure 184 (1:3), Irgacure 1870: Mixture of CGI403 and Irgacure 184 (7:3), and Darocur 4265: Mixture of Darocur TPO and Darocur 1173 (1:1).

Irgacures are produced by Ciba Specialty Chemicals Inc. and Darocurs are produced by Merck Japan.

When a radical photo-polymerization initiator is used as the crosslinking catalyst, it may be used in combination with a sensitizer such as diethylthioxanthone or isopropylthioxanthone and with a polymerization accelerator such as Darocur EDB (ethyl-4-dimethylaminobenzoate) and Darocur EHA (2-ethylhexyl-4-dimethylaminobenzoate).

The amount of the sensitizer when used is preferably 0.1 to 5 parts by mass relative to 100 parts by mass of the curable resin or the curable monomer. The amount thereof is more preferably 0.1 to 2 parts by mass.

The amount of the polymerization accelerator when used is preferably 0.1 to 5 parts by mass relative to 100 parts by mass of the curable resin or the curable monomer. The amount thereof is more preferably 0.1 to 2 parts by mass.

The acid generator is a material capable of generating an acid by application of heat or light, and examples thereof include a thermal acid generator and a photochemical acid generator. In the invention, a photochemical acid generator is preferred.

Examples of the thermal acid generator include benzoin tosylate, nitrobenzyl tosylate (especially, 4-nitrobenzyl tosylate), and alkyl esters of other organic sulfonic acids.

The photochemical acid generator is composed of a chromophore that absorbs light and an acid precursor that is to be converted into an acid after decomposition. Application of light of a specific wavelength excites a photochemical acid generator having such a structure, generating an acid from the acid precursor moiety.

Examples of the photochemical acid generator include salts such as diazonium salts, phosphonium salts, sulfonium salts, iodonium salts, $CF_3SO_3$, $p-CH_3PhSO_3$, and $p-NO_2PhSO_3$ (wherein Ph is a phenyl group), organohalogen compounds, orthoquinone-diazide sulfonyl chloride, and sulfonic acid esters. Examples of the photochemical acid generator also include 2-halomethyl-5-vinyl-1,3,4-oxadiazole compounds, 2-trihalomethyl-5-aryl-1,3,4-oxadiazole compounds, and 2-trihalomethyl-5-hydroxyphenyl-1,3,4-oxadiazole compounds.

The organohalogen compounds are compounds that generate a hydrohalic acid (e.g., hydrogen chloride).

Examples of commercially available products of the photochemical acid generator include the following:

products of Wako Pure Chemical Industries, Ltd., such as WPAG-145 (bis(cyclohexylsulfonyl)diazomethane), WPAG-170 (bis(t-butylsulfonyl)diazomethane), WPAG-199 (bis(p-toluenesulfonyl)diazomethane), WPAG-281 (triphenylsulfonium trifluoromethanesulfonate), WPAG-336 (diphenyl-4-methylphenylsulfonium trifluoromethanesulfonate), and WPAG-367 (diphenyl-2,4,6-trimethylphenylsulfonium p-toluenesulfonate); products of Ciba Specialty Chemicals Inc., such as Irgacure PAG103 ((5-propylsulfonyloxyimino-5H-thiophen-2-ylidene)-(2-methylphenyl)acetonitrile), Irgacure PAG108 ((5-octylsulfonyloxyimino-5H-thiophen-2-ylidene)-(2-methylphenyl)acetonitrile)), Irgacure PAG121 ((5-p-toluenesulfonyloxyimino-5H-thiophen-2-ylidene)-(2-methylphenyl)acetonitrile), Irgacure PAG203, and CGI725; and products of Sanwa Chemical Co., such as TFE-triazine (2-[2-(furan-2-yl)ethenyl]-4,6-bis(trichloromethyl)-s-triazine), TME-triazine (2-[2-(5-methylfuran-2-yl)ethenyl]-4,6-bis(trichloromethyl)-s-triazine), MP-triazine (2-(methoxyphenyl)-4,6-bis(trichloromethyl)-s-triazine), and dimethoxy [2-[2-(3,4-dimethoxyphenyl)ethenyl]-4,6-bis(trichloromethyl)-s-triazine].

The amount of the crosslinking catalyst is preferably 0.1 to 10 parts by mass relative to 100 parts by mass of the curable resin or the curable monomer. The crosslinking catalyst in an amount within this range can provide a sufficiently cured article. The amount of the crosslinking catalyst is more preferably 0.3 to 5 parts by mass, still more preferably 0.5 to 2 parts by mass.

When an acid generator is used as the crosslinking catalyst, an acid scavenger may be added, if necessary, to control diffusion of the acid generated from the acid generator.

The acid scavenger is preferably, but is not limited to, a basic compound such as amines (particularly, organic amines), basic ammonium salts, and basic sulfonium salts. In order to achieve excellent imaging performance, organic amines are more preferred among these acid scavengers.

Specific examples of the acid scavenger include 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidine, hexamethylenetetramine, imidazoles, hydroxypyridines, pyridines, 4,4'-diaminodiphenyl ether, pyridinium p-toluenesulfonate, 2,4,6-trimethylpyridinium p-toluenesulfonate, tetramethylammonium p-toluenesulfonate, tetrabutylammonium lactate, triethylamine, and tributylamine. Preferred among these are organic amines such as 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidine, hexamethylenetetramine, imidazoles, hydroxypyridines, pyridines, 4,4'-diaminodiphenyl ether, triethylamine, and tributylamine.

The amount of the acid scavenger is preferably 20 parts by mass or less, more preferably 0.1 to 10 parts by mass, still more preferably 0.5 to 5 parts by mass, relative to 100 parts by mass of the acid generator.

In the step (3), the mold is released from the transfer target, thereby providing the transfer target having a transferred pattern. The transfer target has a transferred pattern that is an inverted uneven pattern of the mold.

FIG. 1 shows an embodiment of the production method of the invention. In the embodiment shown in FIG. 1, a transfer target containing a photo-curable resin is used and the uneven pattern provided on a roll-like mold can be continually or intermittently transferred to the transfer target. A mold 3 shown in FIG. 1 has an uneven pattern on a surface thereof, and further includes a release layer on the surface. A transfer target 1 sent in the direction indicated by an arrow passes on a roll 2a, reaching the roll-like mold 3 coated with the fluoropolyether (FPE). The rotating mold 3 is pressed to the transfer target 1, and thereby the uneven pattern is transferred to the transfer target 1. At the same time, the transfer target 1 is irradiated with light such as ultraviolet rays, and thereby it is cured. The transfer target 1 having a transferred pattern passes on a roll 2b, and is then sent to the next step. As shown in FIG. 1, light may be applied again as appropriate.

In the embodiment shown in FIG. 1, the mold 3 has a region in contact with the transfer target 1 and a region in no contact with the transfer target 1, and FPE is applied to the mold 3 at a region in no contact with the transfer target 1. This enables continual or intermittent application of FPE to the rotating mold 3. Although the release layer immediately after separation of the transfer target 1 may possibly carry a reduced amount of or completely no FPE, such re-application of FPE before the next contact with the transfer target 1 can supplement the amount of FPE.

As described above, in the embodiment shown in FIG. 1, the release layer is always protected by FPE, which can maintain high releasability even when transfer is repeated or light irradiation is repeated.

The transfer target can directly be used in applications mentioned below, or may be used as a replica mold.

In the case of using the transfer target as a replica mold, the replica mold carries the fluoropolyether adhering to the surface thereof, exhibiting good releasability.

The transfer target may be applied to a wide variety of applications such as electronic, optical, medical, and chemical analysis fields. For electronic devices, the transfer target may be used for integrated circuits for transistors, memories, light-emitting diodes (ELs), lasers, and solar cells. Further, it may be used to prepare films having a regular uneven structure such as solar-concentrating films and liquid crystal polarizers. These devices can provide flexible displays, wireless tags, and wearable computers.

For optical devices, the transfer target may be used for color filters of liquid crystal displays, display pixels of organic ELs, optical memories, optical modulators, optical shutters, second-order harmonic generation (SHG) devices, polarizers, photonic crystals, and lens arrays. For magnetic devices, it may be used for the next-generation hard disk drives (discrete tracks) and the following next-generation hard disk drives (patterned media). For medical devices, it may be used for biochips for arrays such as DNA arrays and protein arrays. For chemical analysis devices, it may be used for microchemical chips of plants and systems such as microchemical plants and microchemical analysis systems.

EXAMPLES

The invention is described with reference to, but is not limited to, experimental examples.

The material compounds used in the experimental examples are described below.

"Demnum methylamine" means a compound of polyfluoropolyether (PFPE) with a methylamine terminal at one end, represented by the formula:

wherein n is an integer of 1 or greater.

"Demnum dimethylamine" means a compound of PFPE with methylamine terminals at both ends, represented by the formula:

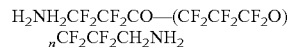

wherein n is an integer of 1 or greater.

In the same way of description, "demnum oil" is a compound with F terminals at both ends, represented by the formula:

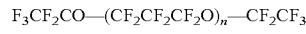

wherein n is an integer of 1 or greater.

"Demnum methyl alcohol" means a compound with a hydroxymethyl ($CH_2OH$) terminal at one end, represented by the formula:

$F_3CF_2CO—(CF_2CF_2CF_2O)_n—CF_2CF_2CH_2OH$ wherein n is an integer of 1 or greater.

"Demnum dimethyl alcohol" means a compound with hydroxymethyl terminals at both ends, represented by the formula:

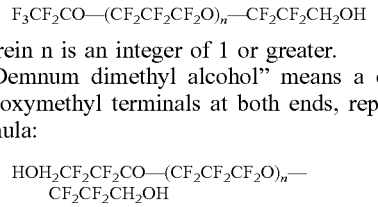

wherein n is an integer of 1 or greater.

"Demnum carboxylic acid" means a compound with a carboxylic acid (COOH) terminal at one end, represented by the formula:

$F_3CF_2CO—(CF_2CF_2CF_2O)_n—CF_2CF_2COOH$ wherein n is an integer of 1 or greater.

"Demnum dicarboxylic acid" means a compound with carboxylic acid (COOH) terminals at both ends, represented by the formula:

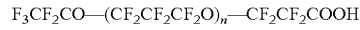

wherein n is an integer of 1 or greater.

"Demnum allyl ether" means a compound with a $CH_2OCH_2CH=CH_2$ terminal at one end, represented by the formula:

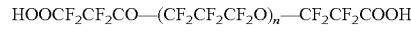

wherein n is an integer of 1 or greater.

"Demnum diallyl ether" means a compound with $CH_2OCH_2CH=CH_2$ terminals at both ends, represented by the formula

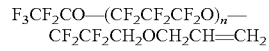

$H_2C=CHCH_2OCH_2CF_2CF_2CO-(CF_2CF_2CF_2O)_n$
$CH_2OCH_2CH=CH_2$ wherein n is an integer of 1 or greater.

The static contact angle and the water sliding angle were determined using a fully automatic contact angle meter DropMaster 700 (Kyowa Interface Science Co., Ltd.) by the following methods.

<Measurement of Static Contact Angle and Water Sliding Angle>

The static contact angle was determined by dropping 2 μL of water or n-hexadecane from a micro syringe onto a substrate placed horizontally and taking a still image with a video microscope one second after the dropping.

The water sliding angle was determined by the following method. First, 20 μL of water was dropped from a micro syringe onto a substrate placed horizontally. The substrate was then tilted at a rate of 2° per second, and the process was recorded as a video with a video microscope until the droplet started to slide. This video was played, and the angle at which the droplet started to slide was defined as the water sliding angle.

Experimental Example 1

<Treatment of Mold with Demnum Oil>

The surface of a quartz glass slide was fluorine-treated with a fluorosurfactant Optool® DSX (Daikin Industries, Ltd., perfluoro(poly)ether group-containing silane compound), and the water contact angle was measured to be 113°. A 0.1 mass % liquid of demnum oil (Mw=2000) treated with HFE7300 was prepared. The quartz glass slide with the fluorine-treated surface was immersed in this treated liquid, and then dried at 60° C. for 10 minutes. Thereby, a mold was obtained.

Experimental Example 2

<Treatment of Mold with Demnum Methyl Alcohol>

A mold was obtained in the same manner as in Experimental Example 1, except that the demnum oil (Mw=2000) was replaced by demnum methyl alcohol (Mw=2000).

Experimental Example 3

<Treatment of Mold with Demnum Methylamine>

A mold was obtained in the same manner as in Experimental Example 1, except that the demnum oil (Mw=2000) was replaced by demnum methylamine (Mw=2000).

Experimental Example 4

<Treatment of Mold with Demnum Carboxylic Acid>

A mold was obtained in the same manner as in Experimental Example 1, except that the demnum oil (Mw=2000) was replaced by demnum carboxylic acid (Mw=4000).

Experimental Example 5

<Treatment of Mold with Demnum Allyl Ether>

A mold was obtained in the same manner as in Experimental Example 1, except that the demnum oil (Mw=2000) was replaced by demnum allyl ether (Mw=4000).

COMPARATIVE EXAMPLES

A quartz glass slide having a surface fluorine-coated with a fluorosurfactant Optool® DSX was used in Comparative Example 1. A quartz glass slide without treatment (water contact angle: 16°) was used in Comparative Example 2.

The appearance was evaluated, and the static contact angles (water and n-hexadecane) and the water sliding angle were determined. The results are shown in Table 1.

TABLE 1

| | Appearance | Contact angle with water (2 μL) | Contact angle with n-hexadecane (2 μL) | Water sliding angle (20 μL) |
|---|---|---|---|---|
| Experimental Example 1 | Good | 115° | 64° | 18° |
| Experimental Example 2 | Good | 112° | 61° | 22° |
| Experimental Example 3 | Good | 110° | 62° | 20° |
| Experimental Example 4 | Good | 111° | 61° | 19° |
| Experimental Example 5 | Good | 116° | 65° | 17° |
| Comparative Example 1 | Good | 113° | 66° | 18° |

Appearance: good means no change from Comparative Example 1, while poor means a change therefrom <Evaluation of Mold Releasability and Release Durability>

To 6.0 g of PAK-02 (Toyo Gosei Co., Ltd.) was added 120 mg (2.0 mass % relative to PAK-02) of Irgacure 907 (Ciba Specialty Chemicals Co.) as a photo-polymerization initiator. The mixture was then stirred for 12 hours using a rotational mixer under light shielding. Thereby, a mold resin material was prepared.

Next, 10 μL of the mold resin material was placed on a silicon substrate and then a mold was placed thereon. The mold resin material was sandwiched between the glass slide and the silicon substrate so as to spread uniformly. The workpiece was irradiated with 500 mJ/cm² of light beams containing 365-nm UV light in a nitrogen atmosphere with the quartz glass surface facing upward. Thereby, the mold resin material was cured. As the mold was released from the silicon substrate, the cured film remained on the silicon substrate. Using the same mold and the same mold resin material, the same procedure was repeated 50 times. For the releasability, the surface of the resulting mold was analyzed, and separation of the cured mold resin material from the silicon substrate and adhesion of the cured mold resin to the mold were observed. The releasability was evaluated on a two-point scale as follows.

(Degree of Separation Between Silicon Substrate and Cured Mold Resin Material)

A: No separation of the cured mold resin material was observed.

B: Separation of the cured mold resin material was observed.

(Degree of Adhesion of Cured Mold Resin Material to Mold)

a: No adhesion of the cured mold resin material to the mold was observed.

b: Adhesion of the cured mold resin material to the mold was observed.

In Experimental Examples 1 to 5, the mold was immersed in the treated liquid after every 50 transfers. The release durability was evaluated by the number of transfers at which adhesion of the cured mold resin material to the mold was observed.

The results are shown in Table 2.

TABLE 2

| | Separation between silicon substrate and cured mold resin material | Degree of adhesion of cured mold resin material to mold | Number of transfers (times) |
|---|---|---|---|
| Experimental Example 1 | A | a | >500 |
| Experimental Example 2 | A | a | >500 |
| Experimental Example 3 | A | a | 400 |
| Experimental Example 4 | A | a | 400 |
| Experimental Example 5 | A | a | >500 |
| Comparative Example 1 | A | a | 250 |
| Comparative Example 2 | B | b | <50 |

REFERENCE SIGNS LIST

1: Transfer target
2a, 2b: Roll
3: Mold

The invention claimed is:

1. A method for producing a transfer target, comprising the steps of:
   (1) applying a composition containing a fluoropolyether to a release layer of a mold having an uneven pattern on a surface thereof;
   (2) pressing the mold to a transfer target and transferring the uneven pattern; and
   (3) releasing the mold from the transfer target, thereby providing the transfer target having a transferred pattern,
   wherein the fluoropolyether is free from a hydrolyzable group.

2. The production method according to claim 1, wherein the transfer target contains an ultraviolet-curable resin.

3. The production method according to claim 1, wherein in the step (2), the transfer target is irradiated with ultraviolet rays while the mold is pressed to the transfer target.

4. The production method according to claim 1, wherein the composition further contains a solvent.

5. The production method according to claim 1, wherein the fluoropolyether is represented by the following formula:

$$R^{111}-(R^{112}O)_m-R^{113}$$

wherein $R^{111}$ and $R^{113}$ each individually represents a C1-C16 alkyl group, a C1-C16 fluorinated alkyl group, or ~$R^{114}$—$X^{111}$ wherein $R^{114}$ is a single bond or a divalent organic group, and $X^{111}$ is —$NH_2$, —OH, —COOH, —CH=$CH_2$, thiol, or an aryl;
$R^{112}$ is a C1-C4 fluorinated alkylene group; and
m is an integer of 2 or greater.

6. The production method according to claim 5, wherein $X^{111}$ is at least one selected from the group consisting of —OH, —COOH, thiol, and —CH=$CH_2$.

* * * * *